US012469635B2

(12) United States Patent
Sutardja

(10) Patent No.: US 12,469,635 B2
(45) **Date of Patent: *Nov. 11, 2025**

(54) TRANSFORMER STRUCTURE

(71) Applicant: Sehat Sutardja, Las Vegas, NV (US)

(72) Inventor: Sehat Sutardja, Las Vegas, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/516,838

(22) Filed: Nov. 21, 2023

(65) Prior Publication Data

US 2024/0212926 A1 Jun. 27, 2024

Related U.S. Application Data

(63) Continuation of application No. 17/974,434, filed on Oct. 26, 2022, now Pat. No. 11,842,845, which is a (Continued)

(51) Int. Cl.

*H01F 27/36* (2006.01)
*H01F 17/00* (2006.01)

(Continued)

(52) U.S. Cl.

CPC ....... *H01F 27/363* (2020.08); *H01F 17/0013* (2013.01); *H01F 19/04* (2013.01);

(Continued)

(58) Field of Classification Search

CPC ......... H01F 27/2804; H01F 2027/2809; H01F 19/04; H01F 27/288; H01F 27/2885;

(Continued)

(56) References Cited

U.S. PATENT DOCUMENTS 4,174,510 A 11/1979 Smith et al.
5,015,972 A 5/1991 Cygan et al.

(Continued)

FOREIGN PATENT DOCUMENTS

CA 2 366 582 7/2010
KR 1020090118605 A 11/2009

(Continued)

*Primary Examiner* — Ryan Johnson

(57) ABSTRACT

A transformer comprising a primary winding and a secondary winding. The primary winding has $N_2$ number turns and having a first terminal and a second terminal. The secondary winding has having $N_1$ fractional portions, which together form a full turn, are in close proximity to the primary winding to establish coupling between the primary winding and the $N_1$ fractional coil portions, the transformer turn ratio from the primary winding to the secondary winding is $N_2:(N_3/N_1)$ where $N_2$ is an integer equal to or greater than 1, $N_1$ is an integer greater than or equal to 2, and $N_3$ is an integer greater than or equal to 1. Also disclosed is a stacked (Continued)

integrated transformer having a primary winding and secondary winding of which one or both have a waterfall structure and a portion of which functions as a ground connected shield between the secondary winding and the primary winding.

18 Claims, 20 Drawing Sheets

Related U.S. Application Data continuation of application No. 16/559,578, filed on Sep. 3, 2019, now Pat. No. 11,495,400.

(60) Provisional application No. 62/876,280, filed on Jul. 19, 2019, provisional application No. 62/726,170, filed on Aug. 31, 2018, provisional application No. 62/725,710, filed on Aug. 31, 2018.

(51) Int. Cl.

| | |
|---|---|
| ***H01F 19/04*** | (2006.01) |
| ***H01F 27/28*** | (2006.01) |
| ***H01F 27/32*** | (2006.01) |
| ***H03H 7/38*** | (2006.01) |

(52) U.S. Cl.
CPC ....... *H01F 27/2804* (2013.01); *H01F 27/288* (2013.01); *H01F 27/32* (2013.01); *H01F 27/36* (2013.01); *H03H 7/38* (2013.01)

(58) Field of Classification Search
CPC ...... H01F 27/289; H01F 27/36; H01F 27/363; H01F 27/346; H01F 2027/2819
See application file for complete search history.

(56) References Cited

U.S. PATENT DOCUMENTS

| | | | | |
|---|---|---|---|---|
| 8,704,193 | B1 | 4/2014 | Kholomeev | |
| 11,495,400 | B2 | 11/2022 | Sutardja | |
| 11,842,845 | B2 * | 12/2023 | Sutardja | H01F 27/36 |
| 2008/0139131 | A1 | 6/2008 | Macphail | |
| 2008/0197963 | A1 | 8/2008 | Muto | |
| 2010/0289610 | A1 | 11/2010 | Jacobson | |
| 2013/0267185 | A1 | 10/2013 | Chen et al. | |
| 2014/0028433 | A1 | 1/2014 | Kim | |
| 2014/0224998 | A1 | 8/2014 | Kholomeev | |
| 2017/0317658 | A1 | 11/2017 | Gianesello et al. | |

FOREIGN PATENT DOCUMENTS

| | | |
|---|---|---|
| WO | WO 2000/062420 | 10/2000 |
| WO | WO 2007/142862 | 12/2007 |

* cited by examiner

TRANSFORMER STRUCTURE

1. FIELD OF THE INVENTION

The invention is related to transformers and isolation devices and in particular radio frequency (RF) transformers and isolation devices.

2. RELATED ART

Miniaturization of radio communication devices has made significant leaps over the last decade with new developments in integrated circuits (IC). These developments have assisted in the miniaturization of many components.

Transformers are commonly used in communication devices to provide a variety of functions such as impedance transformation and isolation, such as between an output amplifier and an antenna. In RF integrated circuits, high frequency RF transformers are also widely used as impedance matching circuits. An example is a step-up output transformer for WIFI and LTE RF power amplifiers. RF transformers are also used to provide common mode isolation or to perform differential to single ended signal conversion (and vice versa).

Transformer physical sizes are however notoriously large in nature when compared to the sizes of transistors in modern silicon technology. Unlike silicon transistors, transformer physical sizes are non-scalable; resulting in higher chip cost when using more advanced silicon process technology. It would therefore be of great interest if these transformers were to have improved performance over prior art designs and still be integrated.

Further, challenges exist in attempts to make integrated transformers capable of operating at high frequencies, such as radio frequency and above. Surface mount transformers are one proposed solution, but such designs are large in size and consume valuable circuit board space thereby limiting circuit size reduction, such designs have limitations in performance and cost.

Integrated transformers are another proposed solution, however integrated circuits also pose challenges as circuits and systems operate at higher frequencies. For example, prior art circuit designs, when presented with high frequency signals, suffered from unwanted reflections from a secondary winding to a primary winding, high capacitance, and poor Q or K factors.

A transformer could either be a step-up or a step-down transformer, or simply a unity transformer with a transformation ratio of N1:N2, N2:N1 or simply 1:1 respectively; where N1 and N2 are integer numbers equal or higher than 1. At the upper GHz operating frequencies (beyond around 5 GHz), N2 is usually set at the lowest possible integer number which is equal to "1" in order to achieve the highest possible Quality Factor Q.

For a step-down transformer at the upper GHz operating frequencies the transformer is therefore normally denoted as an N1:1 transformer. Conversely for a step-up transformer it is normally denoted as a 1:N1 transformer. Even at the lower GHz operating frequencies where higher inductances are required for the transformer windings, it is very rare we see N2>2. Therefore, even at the lower GHz frequency range, transformer designs don't normally use, for example an 8:4 transformer. Instead a transformer will more likely be a 4:2 transformer to achieve an equivalent 2:1 ratio.

Therefore, there is a need in the art for a transformer design which optimizes space consumption while also having performance parameters that do not degrade system performance. Concurrently, the transformer is required to have a high coupling coefficient, low resistance, and minimize reflection from the higher voltage winding to the lower voltage winding.

SUMMARY

When designing and constructing RF transformers, there are several factors to consider and several challenges to overcome. As used herein, the term RF is defined to mean, but is not limited to, cellular bands, WIFI bands and millimeter wavelength bands, such as but not limited to ½ GHz to 100 Ghz. The designs disclosed here may also be used, to gain the benefits described below, in integrated circuits, or in non-integrated application, either as part of a printed circuit board or as a discrete separate element. Any embodiment disclosed herein may be embodied as an integrated transformer, as part of a printed circuit board, or as a separate discrete element such as mounted on a circuit board or a free-standing element. For example, TV bands are at a frequency range which may not be suited for integration, but which would still benefit from the transformer designs disclosed herein. One aspect to consider and which must be optimized or balanced with other performance parameters is the K factor, defined as the coupling coefficient. The K factor refers to the fraction or amount of magnetic flux produced by one winding that couples into a second winding. A higher K factor, up to a maximum of one, is ideal.

The Q factor is also an important design consideration. The Q factor is typically used in reference to inductors and sometimes for transformers. For a transformer, the Q factor may be considered an indicator of loss within the transformer due to resistance/impedance. The higher the Q factor, the lower the losses within the transformer due to lower resistance. Thus, a higher Q factor is preferred to reduce signal loss and attenuation. Typically, for integrated inductors the Q factor is not greater than 10 while discrete coil wire inductors can have a Q factor as high as 60.

While it is desirable to have a high Q factor, achieving this at the expense of other transformer operational parameters is unwanted. For example, increasing the Q factor may come at the expense of a resonance frequency that is too low for the desired operating frequency. A transformer with too much capacitance may be useless for radio frequencies if the resonance frequency is too low. For example, if the operating frequency is 5 GHz but the resonance frequency is 4 GHz, then the transformer is not usable for this application. It is preferred for the transformer to have a resonance frequency that is higher than the operating frequency.

Another factor that must be considered when designing a RF transformer is capacitance. This is a significant design challenge in prior art transformers. As is understood in the art, capacitance occurs when a conducting conductor is adjacent another conductor. This is a common arrangement in a transformer where flux coupling occurs. The capacitance is typically balanced with the coupling coefficient K, which is also important. It is preferred to have a K factor of 1, which is ideal. However, in an RF transformer, it is almost impossible to have a K factor of one because there must be a spacing filed with an insulating material, between the primary to secondary winding, and thus the winding spacing can not be zero or very close to zero. The closer the spacing between the primary and secondary winding, the better the coupling coefficient K, but reducing this space also increases capacitance.

In the prior art, this converse relationship limited RF transformer performance. For example, it is preferred to have a high resonance frequency, but to achieve this capacitance should be maintained low. To maintain a low capacitance, a larger distance between the primary winding and the secondary winding is required. However, it is also preferred to have a high K factor, and for the K factor to be high, the spacing between the primary and secondary windings should be minimized. This in turn creates more capacitance. These competing performance factors make RF transformer design difficult.

In addition, the insulating material separating the primary and secondary coils in an integrated transformer is typically plastic, glass, or silicon, which has magnetic properties generally equivalent to air. This material does not provide ideal coupling, thereby not optimizing the K factor.

Another design issue is due to the K factor from the primary winding to the secondary winding being dependent on the voltage seen on the secondary winding. If building a transformer that steps up voltage, for example from 1 V to 10 V, then the capacitance from the primary winding to the secondary winding is not referenced from ground but is referenced from 10 volts. Usually capacitance is measured or referenced from ground, but in this case, it is compared to 10 volts on the secondary winding. The secondary winding often has a higher voltage than the primary winding. This has the effect of multiplying the capacitance by the voltage gain of the transformer. This occurrence is similar to the Miller Effect which concerns capacitance and amplification.

Typically, the capacitance from the primary winding to the secondary winding is multiplied by the amount that voltage is stepped up. For step up transformers, this presents a design challenge because with the increased capacitance, the frequency will collapse, and the circuit output will be highly distorted. The primary side circuit will see the signal being transmitted because the secondary side signal will couple back into the primary side. The reflected signal appears as an interferer to the primary side circuit.

In addition, most circuits are differential, but the antenna is single ended with the opposing terminal connected to, or referenced, to ground. This results in coupling from the single ended side which is unbalanced yielding unwanted harmonics including a very high amount of odd order harmonics. High amounts of harmonic signals are not allowed by government regulations because a transmit system is not allowed to transmit outside of its authorized frequency band, and such harmonics reduce transmit signal quality. High order harmonics cross/inter modulate with each other, thus creating unwanted in-band interference signals which may appear in the baseband.

To overcome the drawbacks of the prior art and provide additional benefits, an integrated transformer is disclosed that includes a flat substrate, a primary winding and a secondary winding. The primary winding, on the substrate, comprising a conductor having a first primary terminal and a second primary terminal. The secondary winding, on the substrate, comprises two or more fractional sections, connected in parallel, which together form a complete turn such that each of the two or more fractional sections are adjacent the primary winding to maximize coupling.

In one embodiment, the primary winding is one turn and the secondary winding is one turn which is separated into three fractional sections, which are connected in parallel. In one configuration the primary winding and the secondary winding are in a same plane. It is contemplated that each fractional section has a first terminal and a second terminal. In one embodiment, the first terminal of each fractional section is connected and the second terminal of each section are connected. In one configuration the primary winding, the secondary winding, or both comprise parallel connected fractional sections. In this configuration, the parallel connected first terminal and second terminal of each fractional section provide a differential output from the secondary winding. The transformer may be part of a printed circuit board, ceramic substrate, a semiconductor package, or a semiconductor die containing integrated circuits.

Also disclosed is an integrated transformer comprising a primary winding having $N_2$ number of turns. The primary winding comprises a conductive path having a first terminal and a second terminal, and the conductive path form an inner area generally enclosed by the conductive path. Also part of the transformer is a secondary winding having $N_1$ fractional sections in close proximity to the primary winding to establish coupling between the primary winding and the $N_1$ fractional sections, the transformer having a turn ratio from the primary winding to the secondary winding is $N_2$:$(\mathbf{1}/N_1)$ where $N_2$ is a whole number equal to or greater than 1, and $N_1$ is a whole number equal to or greater than 2.

In one embodiment, the primary winding and the secondary winding are located on the same layer. The integrated transformer may further comprise a substrate such that the primary winding and the secondary winding are located on the substrate. In one configuration, $N_2$ is equal to two and $N_1$ is equal to three. It is contemplated that the $N_1$ fractional sections, when summed, are equal to one.

In one arrangement, the two or more fractional sections portions are connected in parallel. Also disclosed is an embodiment where each two or more fractional sections are of a length that is less than a full turn which reduces impedance and the connection in parallel of the two or more fractional sections reduces impedance, as compared to an impedance of a full turn. The integrated transformer may be of a circuit board or a semiconductor package, or semiconductor die.

Also disclosed is a transformer comprising a primary winding and a secondary winding. The primary winding has $N_2$ number of turns with the primary winding having a conductive path with a first terminal and a second terminal. The secondary winding has $N_1$ fractional portions of a turn in close proximity to the primary winding to establish coupling between the primary winding, and the two or more fractional portions of a turn.

In one embodiment, the secondary winding is two total turns, each turn comprised of at least one fractional portion of a turn. In one configuration, the primary winding and the secondary winding are located on the same layer. In one arrangement, the transformer further comprises a substrate such that the primary winding and the secondary winding are located on the substrate. In one embodiment $N_2$ is equal to one and $1/N_1$ is equal to 0.75. The two or more fractional portions of a turn may be connected in parallel.

It is also contemplated that each two or more fractional portions of a turn are of a length that is less than a full turn, which reduces impedance of the secondary winding and the connection in parallel of the two or more fractional portions of a turn reduced impedance, as compared to an impedance of a full turn. The transformer is one of the following transformer types: a standalone discrete element, in a printed circuit board, in a semiconductor package, integrated as part of an integrated circuit.

Also disclosed herein is a transformer comprising a primary winding and a secondary winding. The primary winding comprising a conductor having two terminals. The secondary winding is adjacent the primary winding and the secondary winding comprises two or more turns, such that each turn is divided into two or more quadrants that include an outer segment closest to the primary winding and one or more inner segments. The outer segment is connected at a first outer segment end to ground, and at a second outer segment end to one of the one or more inner segments. The one or more inner segments has a first inner segment end connected and a second inner segment end. The first inner segment end is connected to either the second outer segment end or another first inner segment end. The second inner segment end connected to either another first inner segment end or an output node for the secondary winding. The one or more inner segments are further from the primary winding than the outer segment. The ground connected outer segment is configured to shield the primary winding from reflection of voltage on the secondary winding.

The transformer may be part of a printed circuit board, a semiconductor package, or a semiconductor die that also contains integrated circuits. A scribe line like structure may form part of the primary winding, the secondary winding, or both. In one embodiment, the output node for the secondary winding connects to an antenna. In one configuration, the transformer has a primary winding to secondary winding turn ratio of 1:1 and there are four quadrants, with each quadrant having one outer shield segment and three inner segments. As described herein, connections between an outer segment and an inner segment, and connections between inner segments occur with a waterfall transition.

For a 1:1 turn ratio a total number of segments is equal to a number of quadrants. For a turn ratio of one to greater than one, a number of segments in each quadrant is greater than a number of quadrants. For a turn ratio of one to less than one, a number of segments in each quadrant is less than a number of quadrants.

In another embodiment, a transformer is disclosed that includes a substrate and a primary winding located above the substrate. Insulation separate the primary winding from the substrate. The primary winding is formed from an electrically conductive material having a first terminal and a second terminal. An insulating material covers the primary winding and two or more shield sections are located over the insulating material that covers the primary winding. The two or more shield sections are aligned with the primary winding such that each of the two or more shield sections have a connection to ground and two or more secondary winding connection points. Insulating material covering the two or more shield sections. A secondary winding is located over the insulating material covering the two or more shield sections above. The secondary winding is aligned with the primary winding and the two or more shield sections. The secondary winding is formed from an electrically conductive material having a two or more secondary winding connection points and two or more output terminals.

In one configuration, the electrically conductive material of the primary winding has a shape that forms an inner area and the two or more shield sections have a shape that does not extend into the inner area. In one embodiment, an antenna connects to the two or more output terminals. The secondary winding may comprise two or more fractional turns. In one embodiment, the transformer further comprises a waterfall structure between each fractional turn.

It is contemplated that the two or more shield sections include spacers between each shield section and the spacers align with the waterfall structure. In one embodiment, the two or more fractional turns are connected in parallel. The transformer is configured as one of the following: discrete element, part of a printed circuit board, part of a semiconductor package, part a semiconductor die containing integrated circuits.

Also disclosed herein is an integrated transformer which has stacked elements, one on top of another, with insulating material between conductive elements. In one embodiment this configuration includes a primary winding formed from an electrically conductive material having a first terminal and a second terminal. An insulating material covering the primary winding. Two or more shield sections located above and aligned over the primary winding, such that each of the two or more shield sections have at least one connection to ground and at least one connection point. An insulating material covers the two or more shield sections. A secondary winding is located above and aligned over the primary winding and the two or more shield sections. The secondary winding is formed from an electrically conductive material and configured with two or more output terminals and electrical connections to the at least one connection point.

In one embodiment, the electrically conductive material of the primary winding has a shape that forms an inner area and the two or more shield sections have a shape that does not extend into the inner area. The transformer may further comprise or connect to an antenna which connects to the two or more output terminals of the secondary winding. In one arrangement, the secondary winding is divided into N number of quadrants and each quadrant contains M number of segments, where N is an integer greater than two and M is an integer greater than two. The transformer may have a waterfall structure between each quadrant. It is contemplated that the two or more shield sections may include spacers between each shield section and the gaps align with the waterfall structure.

In one embodiment, the secondary winding includes two or more segments in each quadrant, such that the two or more segments include at least an inner segment closest to the inner area and an outer segment furthest from the inner area, and two or more segments are connected in parallel. It is also contemplated that the transformer may be configured as one of the following: discrete element, part of a printed circuit board, part of a semiconductor package, part a semiconductor die containing integrated circuits. The two or more shield sections block electrical interference from the secondary winding to the primary winding.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1A:
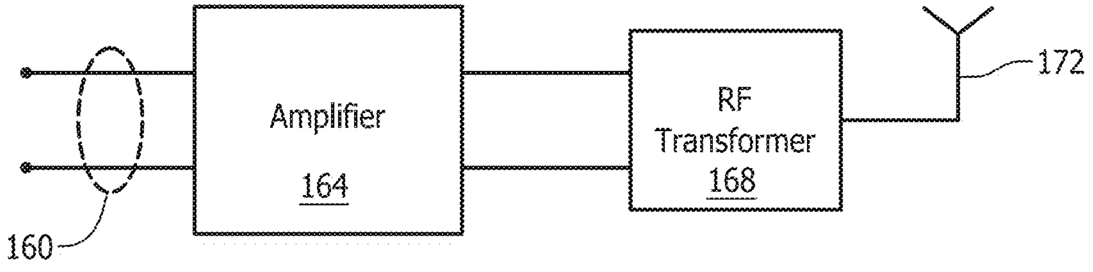
FIG. 1A illustrates an example environment of use of an RF transformer.

FIG. 1A illustrates an example environment of use of an RF transformer. This is but one possible environment of use and it is contemplated that other environments of use exist. As shown, differential inputs 160 provide a signal to an amplifier 164. The amplifier 160 may be any type amplifier. The output of the amplifier is an amplified differential signal which connects to a RF transformer 168. The RF transformer 168 provides isolation and may step up or step down the voltage. The output of the RF transfer is a single ended signal which connects to an antenna 172.

Figure 1B:
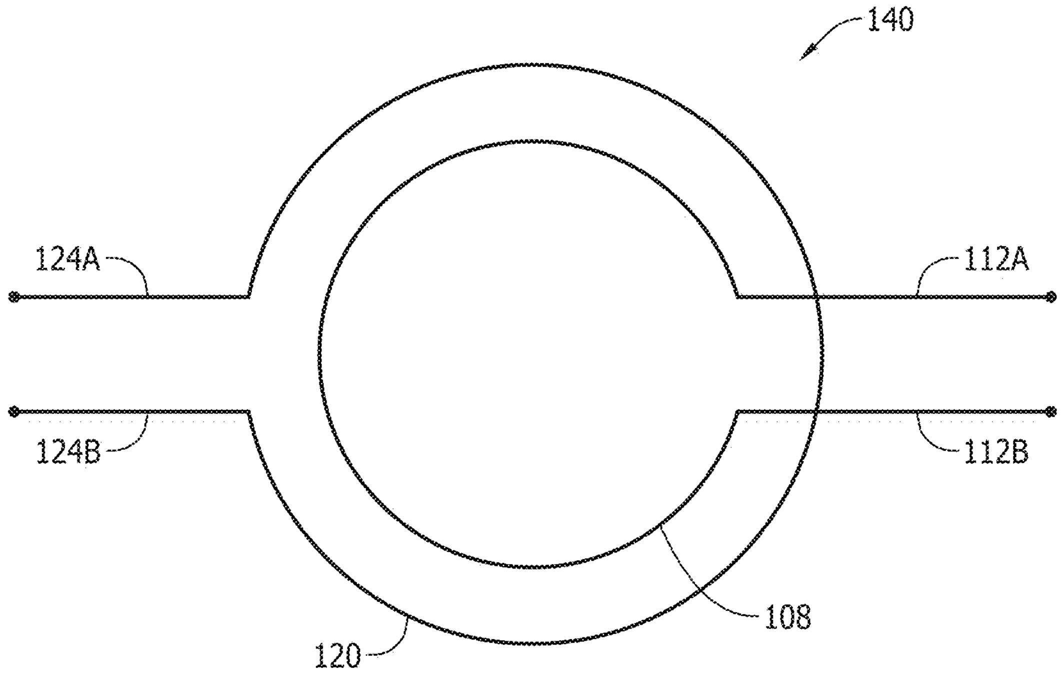
FIG. 1B Prior Art
FIGS. 1B, 1C, and 1D illustrate prior art RF transformer configurations.
Figure 1C:
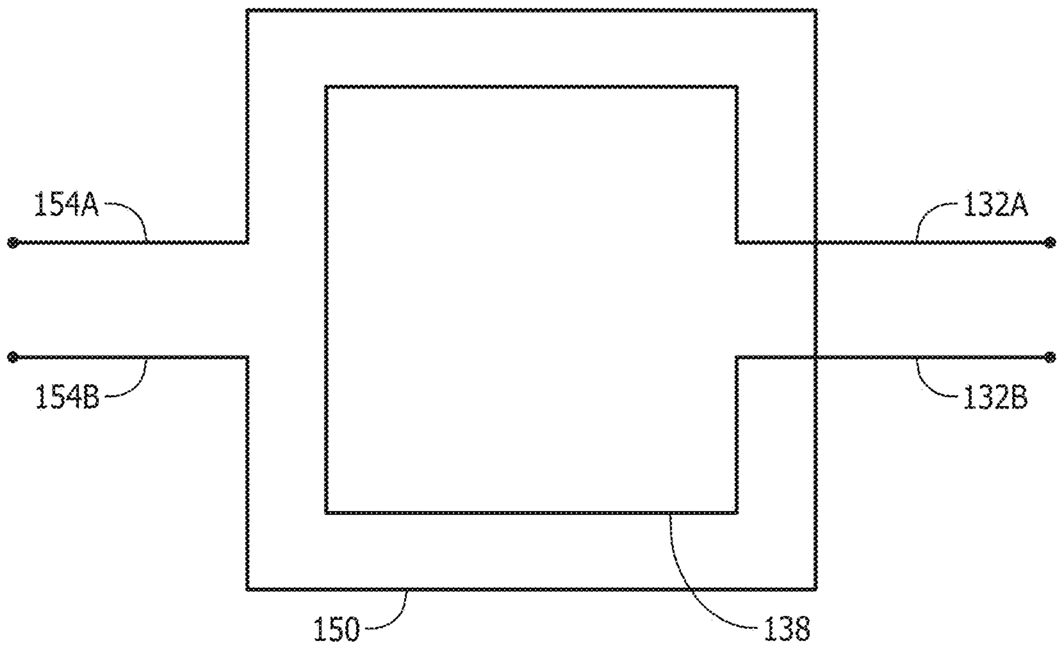
FIG. 1C Prior Art

FIGS. 1B and 1C illustrate example configurations of prior art radio frequency (RF) transformer. Both configurations have primary and secondary windings which have a generally symmetric path. As shown in FIG. 1B, the inner winding 108 is a single turn while the outer winding 120 is also a single turn making the transformer a 1:1 ratio. The inner and outer turn are generally symmetric. The outer turn 120 has terminals 124A 124B while the inner turn 108 has terminals 112A, 112B.

FIG. 1C is another example embodiment of a RF transformer such that the windings are configured as generally square. In this embodiment, the inner winding 138 is a single turn while the outer winding 150 is also a single turn making the transformer a 1:1 ratio. The inner and outer turns are generally symmetric. The outer turn 150 has terminals 154A, 154B while the inner turn 138 has terminals 132A, 132B.

Figure 1D:
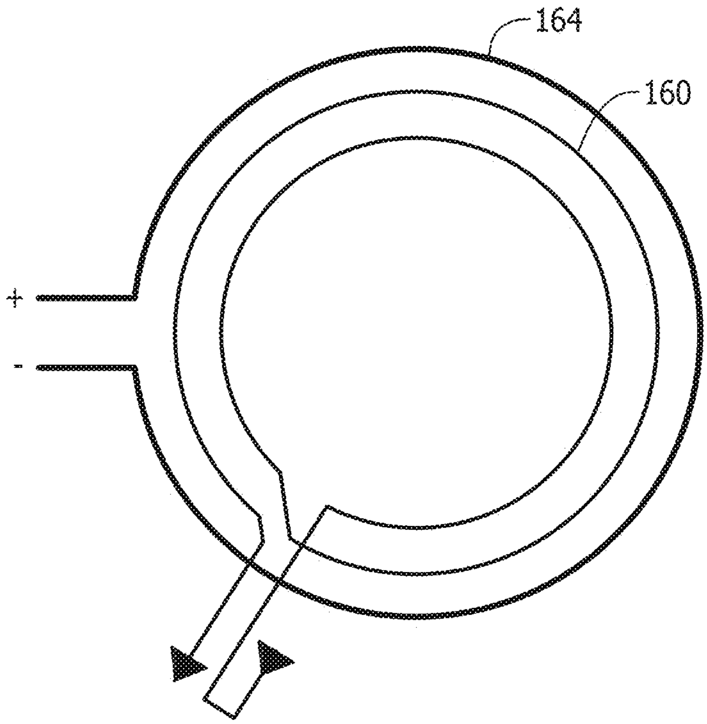
FIG. 1D Prior Art

FIG. 1D illustrates prior art RF transformer configurations. In this embodiment, the inner winding 160 has two turns in a prior art arrangement while the outer winding 164 has a single turn creating a turn ratio of 1:2. The inner (secondary) winding 160 is a concentric winding. Input terminals, the antenna connection, and ground connections are also shown. Distributed active transformers of this nature are available from Axiom Microdevices. of This configuration suffers from the drawbacks of the prior art.

Figure 1E:
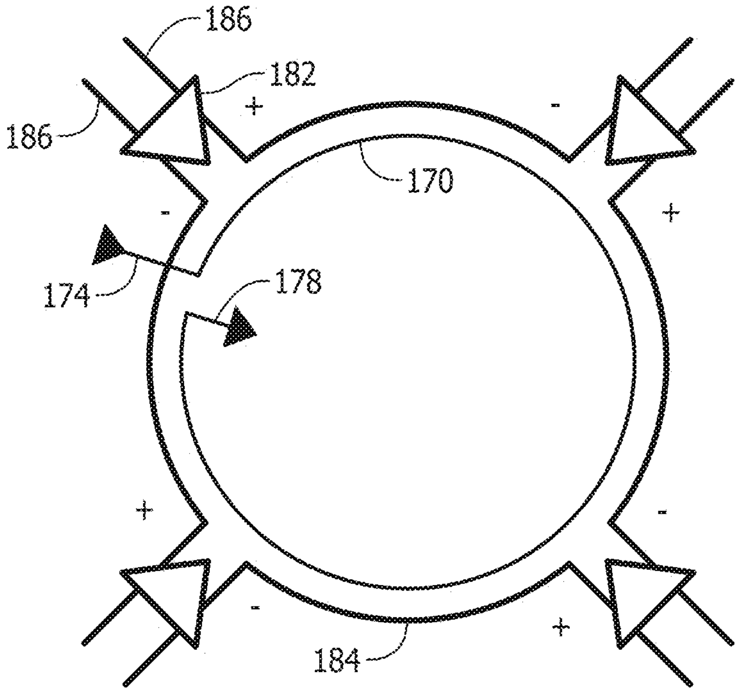
FIG. 1E Prior Art
FIG. 1E illustrates prior art RF transformer configuration for a distributed amplifier transformer.

FIG. 1E illustrates prior art RF transformer configuration for a distributed amplifier transformer. In this prior are configuration, the secondary winding 170 has output terminals which connect to an antenna 174 and a ground node 178. Four amplifiers 182 are connected to the primary winding 184 as shown. Input signals are provided to each amplifier 182 on amplifier inputs 186. An example of such an embodiment is disclosed in U.S. Pat. No. 7,471,153 issued on Dec. 20, 2008. While this prior art configuration divides the primary winding 184 into separate independent sections which are connected by amplifiers 182 in series, has suffers from a large antenna side signal being injected into the primary winding. This design also suffers from the drawbacks of the prior art and requires the quad amplifier connection shown which requires four amplifiers instead of one (which limits use) and increases power consumption as compared to the designs disclosed herein. This design lacks the shield segments and waterfall transition structure, nor are any of the windings connected in parallel.

It is disclosed herein that in some embodiments as few turns as possible are used for transformers operating at the upper GHz frequencies. One challenge to overcome is to build a high frequency transformer that mathematically has an N1:1 transformation ratio while at the same time uses a maximum number of turns of only 1 even on the primary side when N1 is an integer number equal to or larger than 2. Another way of stating this relationship is: the goal is to build a 1:($1/N_1$) step down transformer using no more than one turn for the primary side when $N_1$ is an integer number equal to or larger than 2. As discussed below, in other configurations, other turn ratios and relationships are possible. In addition, the operational parameters described above, such as capacitance, K Factor, Q factor, and resonance frequency must be considered and maintained.

The following definitions are helpful to clarify the following discussion:

Inductor (L). Inductor is traditionally made of a coil of conductor (such as copper wire) in a form of a circle or a square shape. Different sizes and shapes of inductors have different inductance values. The larger the coil is the larger the inductance would be. To be complete even a straight wire for that matter has a parasitic inductance associated with it. In a well-made inductor, parasitic inductance is usually much smaller in value than the main inductance value.

Coil. Historically a coil is a circular form of wire with N number of turns. Coils can be formed in all types of shapes, geometrics and dimensions. Many commercial inductors are referred to as coil inductor. This is an indication that the inductor is made in the form of a coil of wire. It is therefore not uncommon to use the term of coil and inductor interchangeably. The term coil and winding are used interchangeably herein.

Winding. A winding or coil is traditionally made by winding straight metal wire onto a circular bobbin. As used herein the term winding means any conductor forming a primary side or secondary side in a transformer. The word winding is used interchangeably with the word coil could be viewed as turning a wire into a coil. A winding is formed from one or more turns of a conductor. The winding may be made from any conductive materials and may be a traditional wire, a circuit board trace or conductor, or a conductor in an integrated circuit.

Turn. An inductor is traditionally made of at least 1 turn of conductive material such as a wire. Inductors with higher inductance value are made of multiple number of turns. A 1-turn winding has a wire formed into a 360 degree rotation (any geometry) where the beginning and the end of the wire terminate at the same general location. As disclosed herein, fractional turns are possible such that a fractional turn does not extend for a full 360 degrees. Multiple fractional turns may be combined to create a full 360 degree rotation.

Transformer. Defined as two or more inductors that are adjacent to each other. These inductors are magnetically coupled to each other. The closer the spacing between these inductors the higher the coupling coefficient factor.

Transformer Ratio. Defined as the ratio of number of turns between the various windings of the transformer. For a simple transformer with a primary winding and a secondary winding this is essentially the ratio of the number of turns for the primary winding and the number of turns of the secondary windings. It is a ratio of two integers as a transformer must have complete multiples of 360 degree windings to prevent magnetic leakage.

Coupling Coefficient (K). It defines how well the multiple inductors in a transformer coupled to each other. In an ideal transformer where the spacing between the inductors and the sizes of the inductors are essentially equal to zero, K is essentially approach unity or “1”. An ideal transformer has zero leakage inductance by definition.

Fractional Ratio Transformer. A fractional ratio transformer is defined herein as a transformer with at least one of the windings having a non-integer (less than one) number of turns. In order to prevent magnetic leakage, fractional ratio transformer have windings that are multiple sections of 1/N turns and N of such sections are positioned relative to each other in such a way that the sections form a complete 360 degree turn and the sections are loaded equally such as by connecting them to each other, in parallel, or such that the one or more sections are loaded equally. In a fraction ratio transformer, fractional turns, when summed, are equal to an integer value.

Waterfall Structure Transformer. A transformer with waterfall transition structures and shielding structures.

Transformer Input/Output Arrangement. Any transformer configuration or embodiment disclosed herein or derived from any disclosure herein may be configured in any combination with the primary winding having a differential input or singled ended input and the secondary winding having a differential output or singled ended output.

Wire. The term wire as used herein is defined to mean any type conductor used in a transformer. The wire may comprise a traditional wire of any geometry, such as would be wound into a coil, or a conductive trace on a circuit board, a semiconductor package, or an integrated circuit die. The wire may or may not have a surrounding insulating layer associated with the wire.

Segment. A segment is defined herein as a wire in a transformer winding which, when combined form a full turn and which are separated by a waterfall transitions. One of the segments may function as a shield segment while other segments are waterfall segments.

Quadrant. A quadrant is a designation for a division or section of a transformer winding which has a waterfall transition configuration. If a winding having a transformer winding which has waterfall transitions has two waterfall transition, then it has two quadrants, such that the waterfall transitions divide the winding quadrants.

Fractional Ratio Transformer

To overcome drawbacks in the prior art, proposed is a transformer design having (1/N1) turn of the secondary winding suitable for integration into a printed circuit board, silicon chip, or for package integration. First, it is important to note that on the surface using a fractional 1/N1 winding would violate the coupling constraint requirement of building a well-designed transformer. In order to solve this coupling issue, the first step is to establish N1 numbers of 1/N1 turn windings so that together all of the 1/N1 turn windings will have complete and equal couplings to the primary winding (which in this example a single turn primary winding). Then a concept of parallelizing these N1 numbers of 1/N1 turn windings into a single equivalent of 1/N1 winding is used to effectively lower resistance as compared to the individual fractional winding.

Figure 2A:
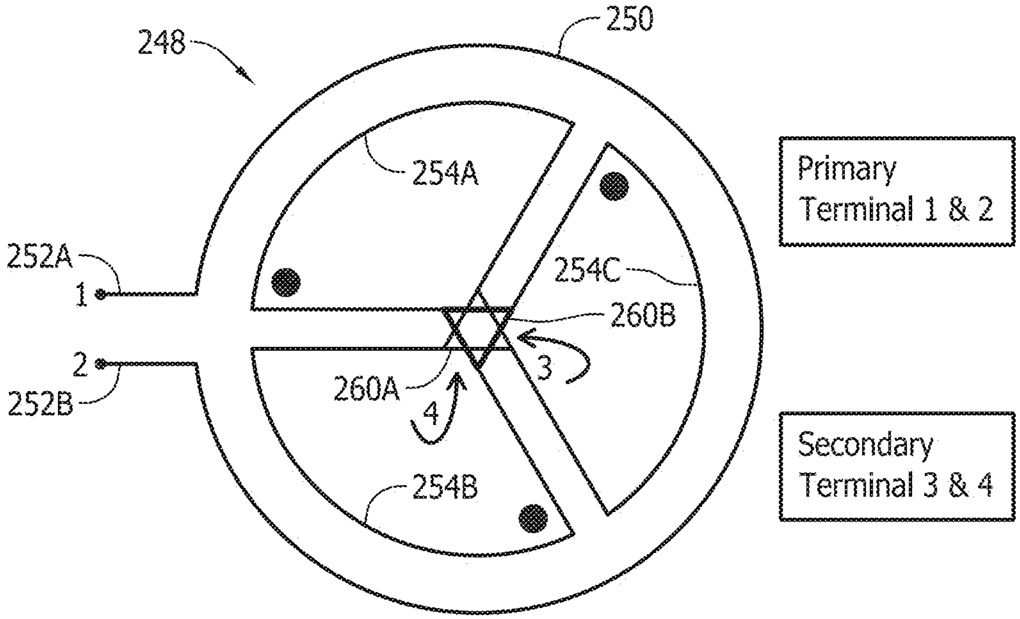
FIG. 2A illustrates a proposed design for a parallel fractional winding transformer.

To illustrate this concept, an example is provided where N1 is equal to 3. In other embodiments, a different number of turns may be established, such that N may equal any positive whole number. FIG. 2A illustrates a proposed design for a parallel fractional winding transformer. An example embodiment of a step-down transformer 248 with a turn ratio of 1:(1/N1) or 1:(⅓) is shown. In the proposed design shown in FIG. 2A all three of the ⅓ turns are connected in parallel. The outer winding 250 is the primary winding and is a single turn winding while the inner windings are three windings 254A, 254B, 254C which are connected in parallel. The outer primary winding 250 has terminals 252A, 252B. The inner secondary windings 254A, 254B, 254C, which are connected in parallel, have terminals 260A, 260B.

Each of the fractional windings are referred to as a winding and each of the fractional windings has a first terminal and a second terminal, i.e., two terminals. Three of the six terminals of the three ⅓ turn (fractional) windings 254A, 254B, 254C (shown without the dot labels) are connected to each other. The other three of the six terminals (shown with the dot labels) are connected together using a second layer metal connection (shown in the center of the inner winding). The windings are effectively connected in parallel.

Figure 2B:
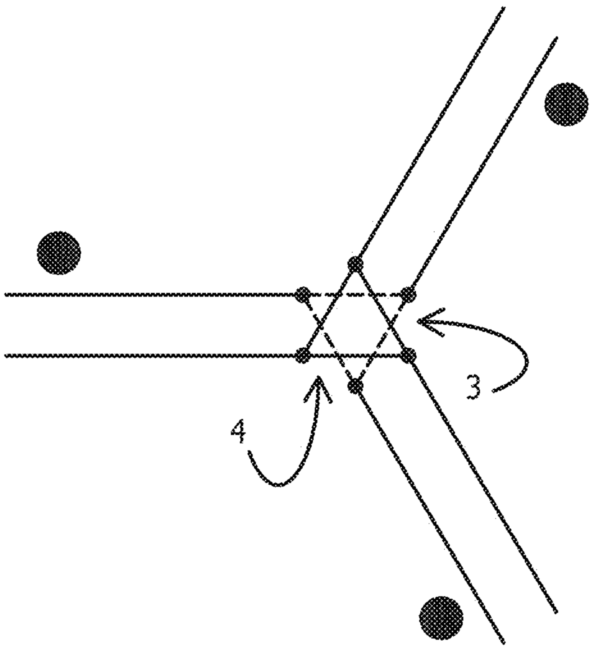
FIG. 2B provides an enlarged view of the central connections (shown at the center of the inner winding of FIG. 2A) between the parallel connected inner winding.

FIG. 2B provides an enlarged view of the central connections (shown at the center of the inner winding of FIG. 2A) between the parallel connected inner winding. The terminals 3 and 4 are shown in both FIGS. 2A and 2B. Likewise, the larger dots, designating winding polarity, are shown in both FIGS. 2A and 2B. It is important to maintain consistent direction when establishing polarity and the dot notation. This can be done by maintaining a consistent (clockwise or counterclockwise) path from the input terminal to the out terminal/ground. The dashed lines show connections at between end points (shown with a small dot), but do not connect to any line which the dashed lines intersect. Small circles are shown at connection points. Hence, the dashed line that crosses the solid line are not connected to the solid line. The dashed lines are on another layer of the multi-layer semiconductor embodied RF transformer.

Each of the three ⅓ turns of the secondary side 254A, 254B, 254C are magnetically "equally coupled" to the primary side 250 due to each fractional section being generally equal length and a symmetric configuration. Equally important, all of the flux from the primary side 250 is completely coupled to the secondary side 254A, 254B, 254C and there is little to no leakage other than the minimal unavoidable leakages due to spacer gaps that are non-zero as well as other external connections that will be needed to connect to actual active circuits. Thus, the transformer coupling coefficient between the primary turn 250 and secondary turn (fractional sections 254A, 254B, 254C) are indeed generally identical to the coupling coefficient of a traditional 1:1 ratio transformer of the same equivalent construction size.

The design disclosed in the variations of FIGS. 2 and 3 have many benefits over the prior art. For an overall maximum diameter or width of the transformer, the low number of turns maintains the size of each turn as larger compared to a winding having many turns, which must have smaller turns to fit in the fixed size. As the turns become smaller, the Q factor is degraded. Thus, the disclosed design maintains a lower turn number, while also maintaining a larger size, which in turn improves the Q factor and maintains a low inductance. In addition, the number of parallel paths, along with the short distance of each parallel path decrease resistance.

Figure 2C:
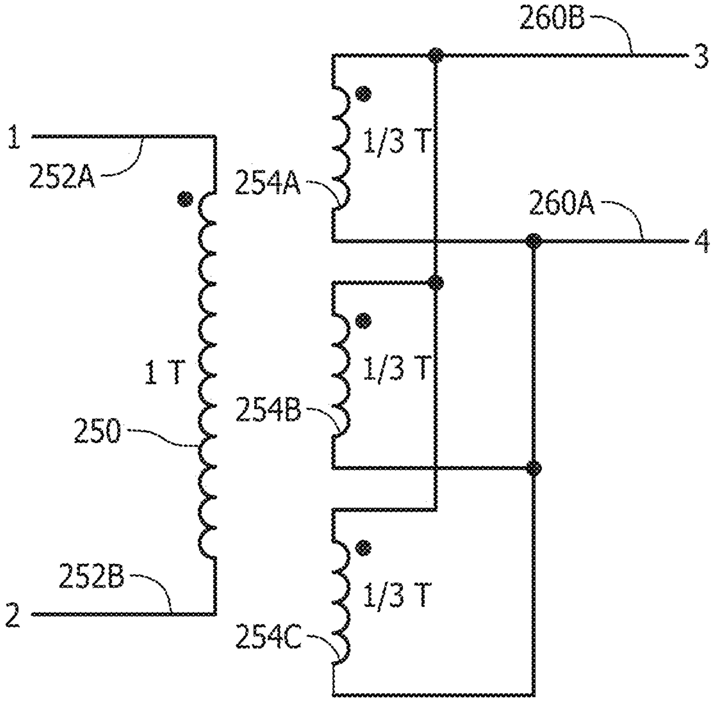
FIG. 2C is a circuit representation of the RF transformer of FIG. 2A to aid in understanding.
Figure 2D:
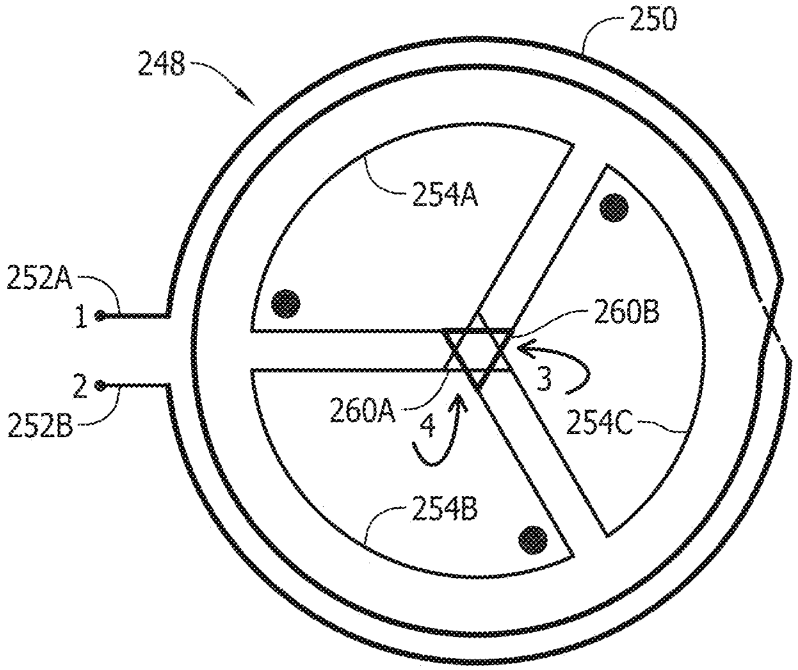
FIG. 2D illustrates an example embodiment of an extremely large turn ratio achieved by doubling the primary turn of the 1:(⅓) transformer as shown in FIG. 2B.
Figure 2E:
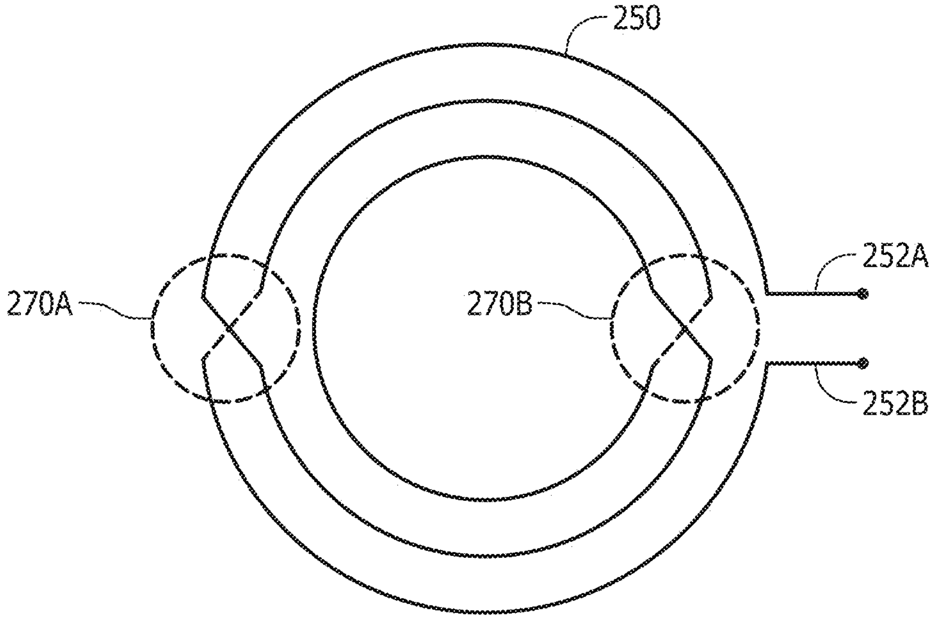
FIG. 2E illustrates an example configuration for a primary winding having 3 turns as could be used in the embodiment of FIG. 2A, FIG. 3A, or any other embodiment disclosed herein.
Figure 2F:
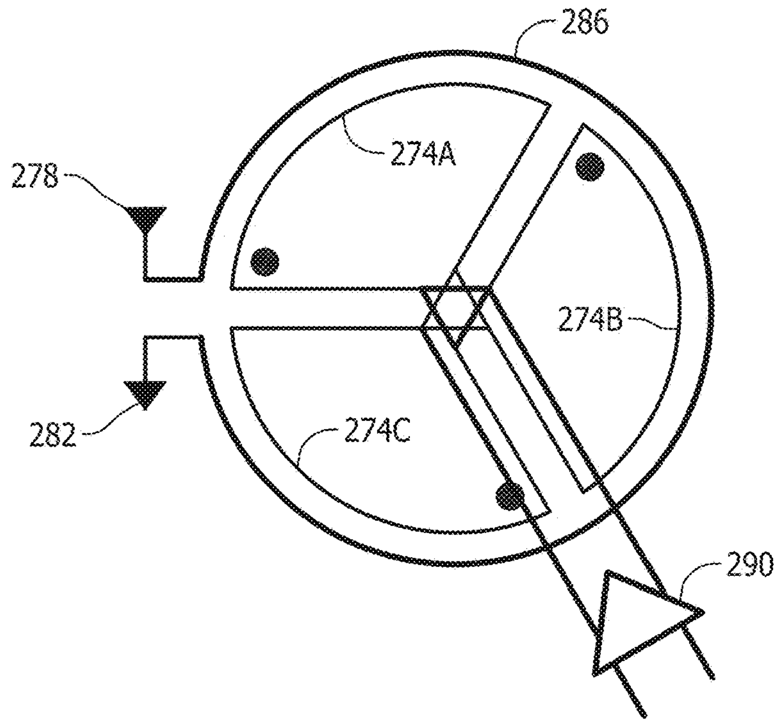
FIG. 2F illustrates an exemplary fractional primary winding.

FIG. 2C is a circuit representation of the RF transformer of FIG. 2A to aid in understanding. Identical elements are labeled with identical reference numbers and a discussion of these elements and connects is not repeated. As can be seen, the three fractional windings 245A, 254B, 254C are in parallel and the terminals 3 and 4 of the secondary winding correspond to the small leads 3, 4 shown in FIG. 2B. The primary winding is 1 turn, while three sections of ⅓ length windings each make up one full turn of the secondary winding. FIGS. 2D, 2E, and 2F are discussed below after the discussion of FIG. 3.

Figure 3A:
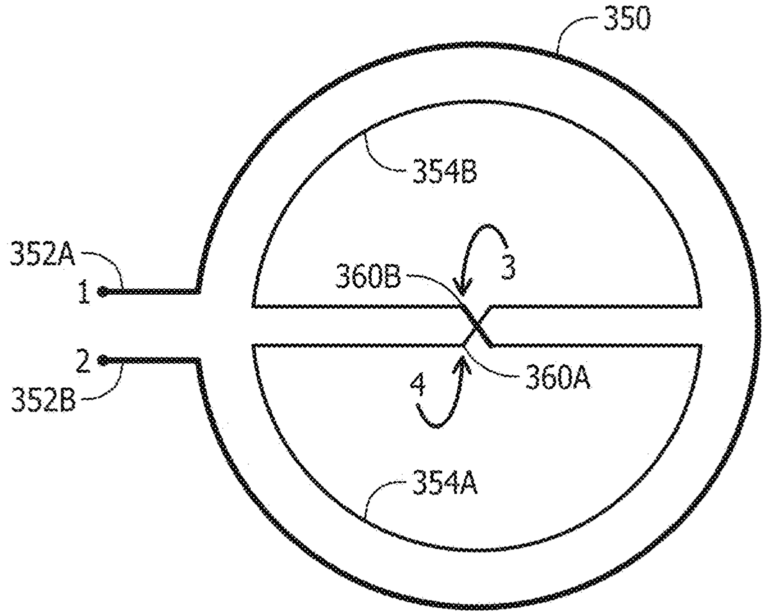
FIG. 3A illustrates an example embodiment of a 1:(½) step down transformer.

To further illustrate this concept, another example embodiment is shown with N1 equal to 2 for a 1:(½) step down transformer. This is shown in FIG. 3A. The outer winding (primary winding) 350 has terminals 352A, 352B. The inner windings (secondary windings) 354A, 354B have terminals 360A, 360B as shown. The sum of the two fractional ½ turn windings 354A, 354B on the secondary side is also equal to 1 full turn and all of the fractional turns 354A, 354B are magnetically equally coupled to the primary side winding 350, establishing two of the ½ turns in parallel to yield a transformer that has a much higher Q when compared to a traditional 2:1 transformer at the upper GHz operating frequencies. This is a significant benefit, among others, of this disclosed design.

Figure 3B:
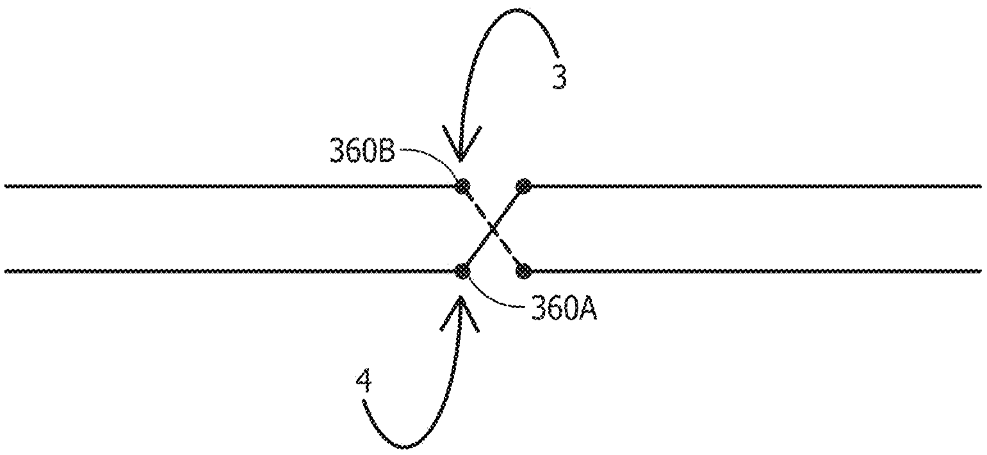
FIG. 3B is an enlarged view of the secondary winding including terminals of FIG. 3A.

FIG. 3B is an enlarged view of the secondary winding including terminals 360A, 360B as shown in FIG. 3A. The dashed line that crosses the solid line is not connected to the solid line. The dashed line is on another layer of the multi-layer semiconductor embodied RF transformer.

Figure 3C:
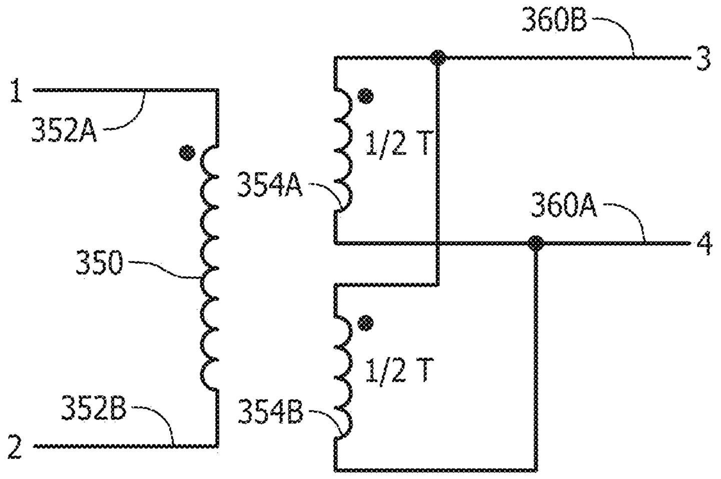
FIG. 3C is a circuit representation of the RF transformer of FIG. 3B to aid in understanding.

FIG. 3C is a circuit representation of the RF transformer of FIG. 3B to aid in understanding. Identical elements are labeled with identical reference numbers and a discussion of these elements and connections is not repeated. FIG. 3C makes clear the arrangement of elements, electrical connections, and the parallel arrangement of the ½ fractional turns of the secondary winding.

A further benefit to the design disclosed herein is that the series resistances of the windings of the 1:(1/N1) transformers are much smaller than their traditional N1:1 counterparts. For example, for a 1:(⅓) step down transformer the series resistance of the secondary turn is theoretically 9 times smaller than the series resistance of a traditional 3:1 transformer. To realize this resistance reduction in a prior art transformer, a 3:1 transformer with a secondary winding having a ⅑ resistance would require the size of the secondary winding to be very small, such as ⅑ of the area of the primary winding. In this embodiment, inductance is based on the length of the wire that forms the winding, but as winding size decreases, performance also decreases.

The disclosed design has such low resistance because each ⅓ fractional winding length is ⅓ as long as a full turn, and thus has ⅓ the resistance of a full turn, resulting in ⅓ resistance reduction, plus the parallel arrangement of the three ⅓ turn windings results in a ⅑ total resistance as compared to a prior art transformer with a 3:1 ratio using single turn without fractional windings.

As winding size decreases, inductance also decreases, but the Q factor is made worse. A low Q factor is undesirable while a high Q factor is preferred. With the disclosed design, the winding size does not need to be excessively small for a very high frequency applications, while a low inductance and a high Q factor is obtained due to the fractional nature of the winding configuration. This is ideal where ultralow inductance is needed on one or more sides of the transformer. This is a significant improvement over the prior art. Even if the extra parasitic resistance is included for the wires connecting the three individual ⅓ turns in parallel, the overall series resistance is still many times lower.

This principle can be further extended such to create a fractional transformer with an even higher transformer turn ratio by making the number of turns of the primary winding to be greater than 1. Generally, this is denoted as N2:(1/N1) step down transformer where N2 is equal to or larger than 1 and N1 is equal to or larger than 2.

For example, if N2 is equal to 2 and N1 is equal to 3 the resulting ratio is a 2:(⅓) transformer that has an unbelievable equivalent mathematical ratio of 6:1 with a footprint size that is generally similar to a traditional 2:1 transformer. Such a design also possesses a very low resistance, for the reasons discussed above, which is not possible with prior art designs. This extremely large transformer turn ratio is achieved by just doubling the primary turn of the 1:(⅓) transformer shown earlier in FIG. 2B. This is shown in FIG. 2D. In FIG. 2D, identical reference number reference identical elements, with the exception of the primary winding 250, which is now two turns instead of one turn.

FIG. 2E illustrates an example configuration for a primary winding having 3 turns as could be used in the embodiment of FIG. 2A, FIG. 3A, or any other embodiment disclosed herein. Only the one winding (the primary winding in FIG. 2E) is disclosed and it is understood that it would be located in proximity to another winding to allow for coupling of magnetic flux. As shown, the winding 250 has two terminals, 252A, 252B, and as such may be configured for a differential or singled ended operation. The winding 250 has two crossovers 270A, 270B. These crossovers 270A, 270B achieve uniform coupling in the windings 250.

FIG. 2F illustrates an exemplary fractional primary winding. This is but one possible fractional winding configuration and one or ordinary skill in the art will appreciate that other fractional numbers may be used, various shapes may be adopted for the windings, and the fractional winding may be located as the inner or outer winding. Further, this fractional winding configuration may be combined with any with a configuration or embodiment shown herein. Either or both of the primary or secondary ($1^{st}$ and $2^{nd}$) winding may be fractional.

In this example embodiment the primary winding comprises three fractional sections 274A, 274B, 274C. The terminals 3, 4 connect to an amplifier 290 such that the amplifier provides the amplified input signal to the primary windings 274A, 274B, 274C. A secondary winding 286 is adjacent each fractional turn 274A, 274B, 274C to achieve magnetic flux coupling. The secondary winding 286 include two terminals which connect to an amplifier 278 and a ground node 282 as shown. As shown, the transformer of FIG. 2F has a differential pair input and a differential pair output configuration and in this embodiment is a ⅓:1 turn ratio which is magnetically equivalent to a 1:3 turn ratio.

Other combinations are possible beyond those shown, such as a ½:1 ratio transformer, ½:2 ratio transformer or a ½:½ ratio transformer. The fractions may vary in value such as but not limited to ½, ⅓, ¼, ⅕, ⅙ or any 1/N where N is any whole positive number. Either winding may be a fractional turn structure. Further, it is disclosed herein that the amplifier 290 may be replaced with a receiver.

The low series resistance property of the fractional $1/N_1$ turns is extremely useful for high current (or power) applications as it drastically reduces the $I^2R$ losses. At beyond 5 GHz operating frequency this allows high ratio $N_2$:$(1/N_1)$ step down transformer in a very compact form factor. Conversely, it would also allow the reverse $(1/N_1)$:$N_2$ step up transformers. Such high ratio step-up transformers could be useful for the last stage of a high-power CMOS power amplifier using low voltage MOS transistors for example, and many other applications.

The transformer structure may be configured with a generalized ratio of $(1/N_2)$:$(1/N_1)$. In such an embodiment, for example, the primary winding $N_2$ could be 2 and for the secondary winding $N_1$ could be 3. The resulting ratio is therefore ½:⅓. This is mathematically equal to a 3:2 ratio but using only 1 turn each for the primary and secondary turns. Using a fewer number of turns, such as only one turn for each of the primary and secondary instead of a prior art 3 turns and 2 turns for the 3:2 turn ratio configuration reduces inductance and resistance which consequently improves operation at high frequency, such as radio frequencies as defined herein. In addition, a 3 turn winding would have to be made extremely small for operation at 6 GHz while a 1 turn winding made from three ⅓ turn fractional sections would not have to be made as small because it has only one turn, albeit fractional.

By way of example, the three turn winding may only be 50 microns in size while the one turn winding would be 200 microns in size. It is preferred to have a small ratio for the winding bundle size to overall transformer diameter to achieve better performance. A very special case would be when N2 and $N_3$ are the same ($N_2$=$N_3$) which would result in an effective ratio of 1:1. This may be represented at a ⅓:⅓ ratio. The benefit of having fractional windings on both the primary side and secondary side is drastically lower resistance and a higher Q factor that is useful for extreme high frequency operations (beyond 10 GHz).

An example in which it may be preferred to have $N_2$ larger than 1 is for cellular radio applications (low 1-2 GHz operating frequencies). In such systems, it may be desirable to have an equivalent of a 4:1 transformer but with an equivalent size of a 2:(½) transformer while at the same time the transformer would have a much higher quality Q factor than possible with prior art designs. In such a design the primary windings would have two turns while the secondary winding would have two ½ fractional windings. This would be a combination of the primary winding 250 from FIG. 2D and the secondary windings 354A, 354B from FIG. 3A. Fractional turn transformers would allow many new integrated circuit products to be built with integrated transformers as the cost would be more attractive with smaller transformer components.

Another benefit of the compact area of these high ratio $N_2$:$(1/N_1)$ transformers is that the transformers (which tend to be smaller in sizes as compared to traditional transformers) can now be directly placed on top of active transistors. This allows integrated circuit designers and manufacturers to save even more of the valuable silicon area of the RF chips. Many of the RF circuit topologies of the prior art that relied on the need to use many discrete RF transformers can now be ported into silicon chips with minimal or no additional cost. Without this new fractional transformer topology, many of the transformer intensive RF circuits would otherwise not be viable for commercial applications or simply not possible to be built especially when the transformer quality Q factor requirement is very high.

While the disclosure above shows a single turn that could be divided by $N_1$ where $N_1$ is an integer that is equal or larger than 2, there is no restriction that the configuration must stay with a single turn to start with. It is thus contemplated and disclosed, for example, that there could be 2 turns (or any integer) number of windings on either the primary side or secondary side of the transformer. These turns can be divided into $N_1$ segments. As such, each length of the wire segments has an equal length of $2/N_1$ in this example embodiment. The simplest example is when $N_1$ is equal to 3 using a total of 2 turns of wire. Each divided wire is therefore ⅔ in length and there are 3 of such wires. When these three ⅔ wire segments are connected in parallel to each other it results in a transformer ratio of $N_2$:(⅔). When $N_2$ is equal to 1, the result is a transformer ratio of 1:(⅔). Other integer over integer ratios are possible using this design arrangement, such as 2:(⅔) and (⅓):(⅔). This arrangement can be further generalized to $N_2$:$(M_1/N_1)$ where $M_1$, $N_1$, and $N_2$ are the same or different values and comprise a number equal to or larger than 1. It is also contemplated that $N_2$ could be $1/N_2$ or even $M_2/N_2$.

Figure 4:
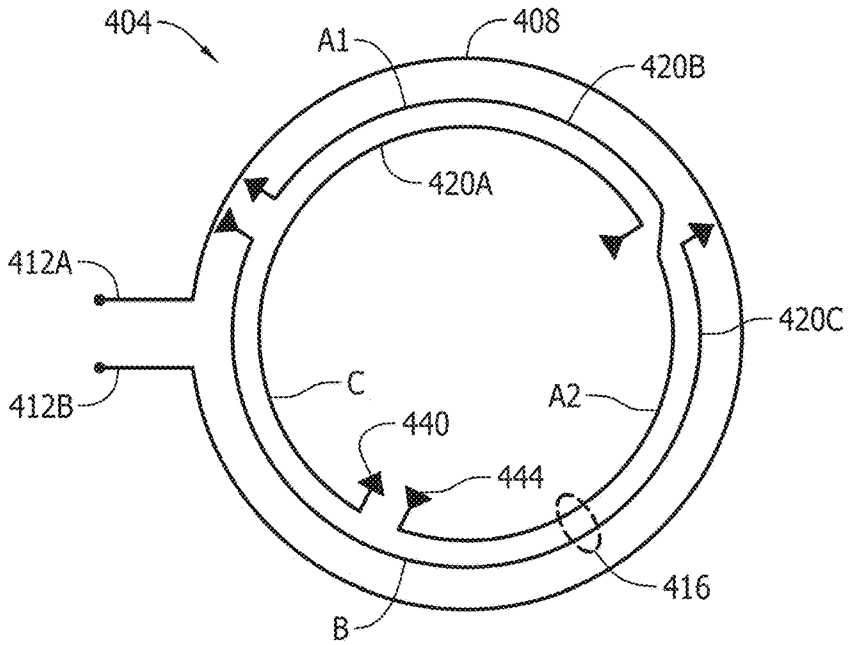
FIG. 4 illustrates a transformer fractional ratio of 1:(⅔).

FIG. 4 illustrates an example embodiment of a transformer having a fractional ratio of 1:(⅔). This is but one example embodiment. As shown, the 1:⅔ transformer 404 includes primary winding 408 having input terminals 412A, 412B. The primary winding 408 is a single turn winding but in other embodiments it may be more than one turn (see FIGS. 2D and 2E) or a fractional turn winding. A secondary winding 416 comprises 3 sections which are each ⅔ of a turn in length. As shown, the secondary winding 416 comprises 3 fractional winding sections 420A, 420B, 420C. These three windings are electrically connected in parallel. When combined, the segment lengths equate to ⅔+⅔+⅔=6/3–2. Stated another way, the three segments are defined as segments A1+A2, segment B, and segment C where the length of segments A1+A2=B=C. As is understood in the art, slight variances from 'exactly equal' occur during manufacturing and may even be intentional without departing from the inventive concept and the claims that follow. The secondary windings 416 has common antenna connects and ground connections as shown.

As a result, unique transformer ratios may be built that were not possible in the prior art and this ratio has low impedance and a high Q factor. This concept may be extended to other factional ratios, such as four segments, each with a length that is ¾ of a full turn such that ¾+¾+¾+¾=¹²⁄₄=3 turns.

In summary, in one or more embodiments, the various disclosed innovations enable and provide a compact high turn ratio transformer which includes the concept and configuration that splits the wire of a single turn winding into $N_1$ generally equal winding sections where $N_1$ is an integer number equal to or larger than 2. The design connects $N_1$ of these sections in parallel in such a way that all of the signals are in phase with each other and the sections are connected as denoted by the dot symbols in the figures. Although shown with 2 fractional turns or 3 fractional turns it is contemplated that any number of fractional turns may be used on the secondary winding or even the primary winding. In addition, it is also contemplated that the primary winding may have an integer number of turns or fractional configured turn(s) or that the secondary winding or primary winding could be a fractional winding, i.e. a single turn comprising of multiple parallel connected windings or multiple turns comprising of multiple parallel connected windings. Also disclosed herein are different shapes for the RF transformer than the circular shape shown in FIGS. 2B and 3B. Contemplated shapes include but are not limited to squares, triangles, hexagons, octagons, pentagons, heptagon, nonagon, decagons, or any other shape. The transformer designs disclosed herein are contemplated to be integrated or formed on a semiconductor device, die, package or any other arrangement. Either the primary winding, secondary winding, or both may be fractional turn structures and have any number of turns or any number of fractional turns.

Transformers With Waterfall Transitions and Shield Segments

With very few exceptions practically every modern integrated circuit design is built with differential circuit topology. The reason differential circuit topology is preferred is because differential circuits are inherently more robust against common mode interference from power supplies than that of their single ended counterparts. It is the main reason why practically every CMOS RF integrated circuit today is built using differential implementations even though historically discrete RF circuits had been exclusively built with single ended topology.

However, when implemented, any RF integrated circuits eventually still have to interface to single ended devices such as the single ended antennas, which are found in all cellular phones and radios. This job of performing the differential to single ended signal conversion is dedicated to the RF transformer.

A differential to single ended transformer is however inherently un-balanced in nature. It is unbalanced because on one side of the transformer (for example the primary side in an RF power amplifier circuit) the signal pins are connected differentially, meaning the AC signals are moving in equal but opposite directions to each other. However, on the other side of the transformer, (for example the secondary antenna side) one of the signal pins is grounded (connected to GND). What is then left is a single pin carrying the output signal which is now referenced to GND.

Unfortunately, when implemented, there is always parasitic coupling capacitances between the primary signal pins to the secondary signal pins that must be considered because such parasitic coupling capacitances are unwanted. When one side of the signal pins is grounded, the signal coupling from the secondary to primary pins would not be balanced as only the parasitic coupling capacitance from the signal pin would inject signal to one of the differential pins.

A further challenge results occurs due to CMOS RF integrated circuits operating at low voltages while the signal voltage swing at the antenna is many times higher than the typical CMOS transistor operating voltages. For example, when transmitting a typical 1 watt power level signal to a typical antenna that has a 50 Ohm matching impedance, the actual transmitted single ended RF signal has a peak-to-peak voltage swing of +/−10 volts. However, the CMOS transistors that are used to construct integrated RF amplifiers are usually operating only at about 3.3 volts.

One can observe through testing that at a higher GHz operating frequency range, even a 1 pF of coupling capacitance from the high voltage terminal of the secondary transformer terminal to one of the terminals on the primary side would severely disrupt the operation of our low voltage CMOS RF amplifier.

Figure 5A:
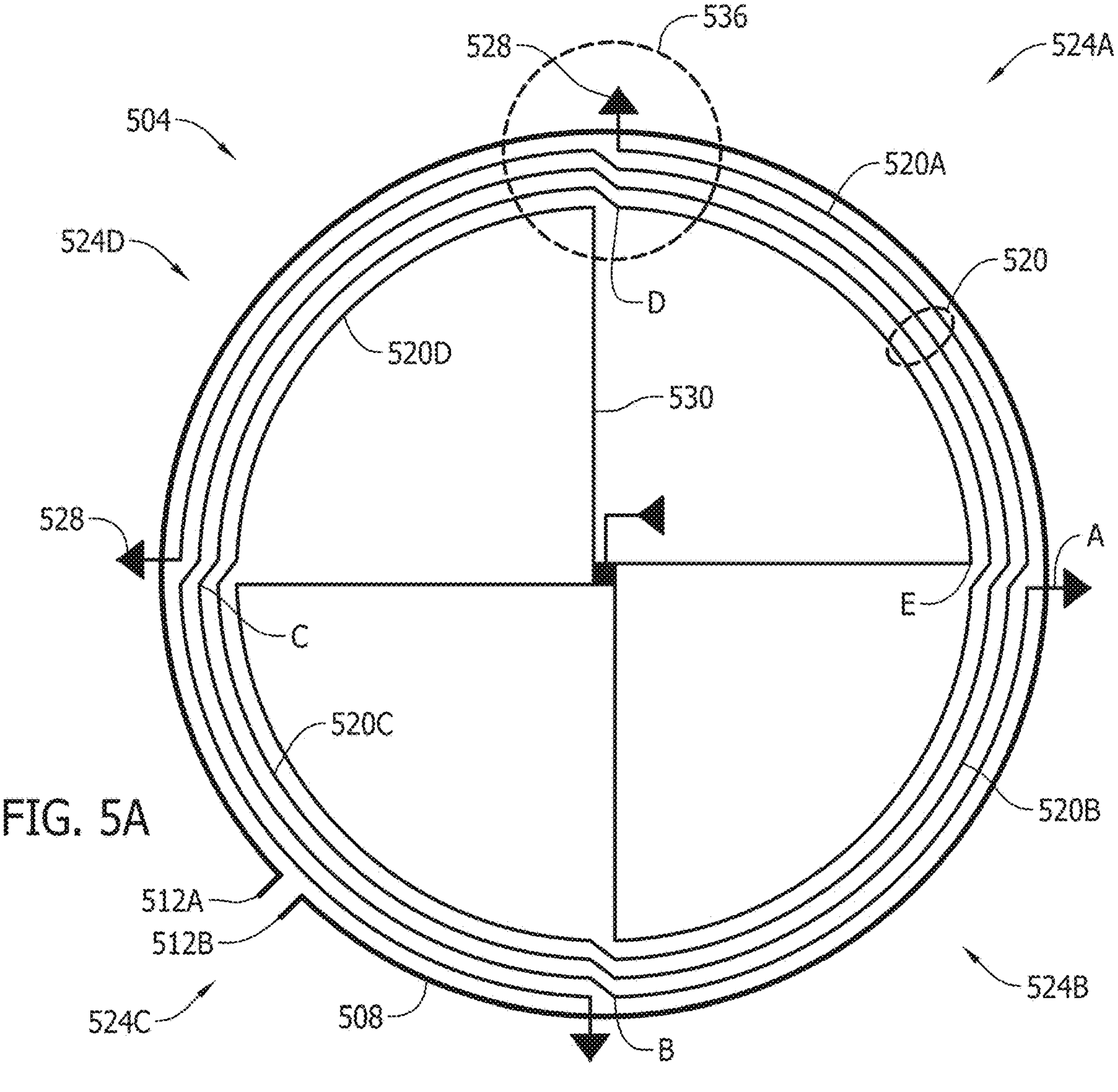
FIG. 5A illustrates an example configuration for a transformer having multiple segments with a waterfall structure.

A discussion is provided that explains and illustrates how to design a transformer that has a reduced signal coupling from the single ended side to the differential side of the transformer. Disclosed is an RF transformer design that has a shielding structure using a new class of winding structure(s). An example of such structure is shown in FIG. 5A. Unique to this new structure is the introduction of what is referred to herein as the segmented multi-strand wires such that the "outer" segments of the multi-strand bundles of wire are winding wires (conductors) that are connected to a ground (plane, terminal, pin) and therefore have the lowest signal amplitude. The segments closest to the primary winding function as shields to prevent or reduce electrical coupling. Moving away from the outer segment in the multi-strand bundle toward the center bundle are winding segments which create multiple versions of the winding. Each of these series connected wire segments are generally identical to each other and are arranged parallel to each other to create an equivalent of a single turn of a winding.

A further disclosed design provides additional benefits over prior art designs as shown in FIGS. 1A and 1B. FIG. 5A illustrates an example configuration for a segmented waterfall structure transformer. This is but one possible arrangement of elements and it is contemplated that the disclosed waterfall structure may be applied to numerous other designs, shapes, and transformer applications. This example embodiment is considered to be a planar arrangement because the various elements (primary winding, waterfall segments, shield segments, secondary winding) are all in the same general plane or level, with the exception of interconnects (also referred to as jumpers) that may extend upward and downward (such as with vias) to connect different elements of the transformer. The term waterfall segment and segment are used interchangeable and are defined to mean segments which are not shield segments.

In this embodiment, the waterfall transformer 504 includes a primary winding 508 which has input terminals 512A, 512B. The primary winding 508 is the outer winding. As discussed below, the primary winding may also form the inner winding, or comprise two parallel connected windings configured as inner and outer windings Located proximate to the primary winding 508 are secondary windings 520 (collectively) which comprise, for one turn, segments 520A, 520B, 520C, 520D. Each quadrant as a similar configuration. In this example embodiment, there are four quadrants 524A, 524B, 524C, 524D. As shown, the segments 520A, 520B, 520C, 520D form a full turn as each segments progresses around the turn in each quadrant. Each segment makes up a fraction of a turn, in this embodiment, ¼ of a turn. This configuration may be referred to as a quarterwave waterfall structure. When transitioning to the next quadrant, the segments waterfalls inward to a more inner position, i.e. further from the other winding. If the secondary coil is on the outside of the primary coil, the waterfall will occur in the opposite direction, i.e waterfall outward. For quadrant 524A, the shield segments 520A is the segments that is the shield segment because it is directly adjacent the primary winding 508. There are four copies of the segments 520A, 520B, 520C, 520D (that form the secondary winding, four segments in each quadrant, and each is rotated 90 degrees (for a quarterwave design as shown) and which when combined in series extend for a full turn. The shield segments is closest the other winding for a fraction of a turn (½ or less) (for one quadrant) and then waterfalls away form the other winding at which points it becomes waterfall segments to complete a turn.

The segments adjacent the primary winding 508, such as segments 520A, act as a shield due to the connection to ground 528 at one end of these segments. The function and benefits of the shield are described below in greater detail. As shown, the shield segments (one in each quadrant) are in parallel and in closest proximity to the primary winding 508. As shown, all the transformer turns are in parallel and in close proximity to the other transformer elements. The shield segments (segment closest to the primary winding 508, such as shield segment 520A) allow for magnetic field coupling from the primary winding to the secondary winding but reduces electrical coupling from the secondary winding to the primary winding (higher voltage winding to the lower voltage winding). The magnetic field from the primary winding is able to cross over the metal shield segment into the secondary winding, but the electrical field from the secondary winding is not able to cross over the metal shield segment into the primary winding. In other embodiment other shapes and configurations are possible.

Moving inward one level (segment) on the secondary winding 520 is segment 520B which is in quadrant 524B. Because the segment 520B is not closet segment to the primary winding 508 it is not longer a shield segment and it is now referred to as a waterfall segment. Waterfall segment 520B captures the magnetic flux from the primary coil 508, which in turn generates a voltage and current in the secondary coil 520. Moving inward one more level (segment) on the secondary winding 520 is waterfall segment 520C in quadrant 524C. This waterfall segments 520C, captures the magnetic flux from the primary winding 508, which in turn generates a voltage and current in the secondary winding 520. Moving inward one additional level on the secondary winding 520 is segment 520D in quadrant 524D. This waterfall segment 520D captures the magnetic flux from the primary coil 508, which in turn generates a voltage and current in the secondary winding 520. The end of the inner most (last) waterfall segment, in this embodiment 520D connects to an antenna (not shown) or is the output (or input) terminal 530 of the secondary winding 520. In this example embodiment, the secondary winding is single ended such that one terminal of the winding connects to ground 528 while the other end is the output (or input) terminal 530.

For the quarter-wave waterfall structure disclosed, each shield segment extends for ¼ of the distance of a turn of the winding. There are four copies of the secondary winding, each placed ninety degrees apart (rotated) from the next copy. For other wave values, such as ⅓ wave configuration, each shield segment extends ⅓ of the winding distance. As such there would be three copies of the secondary winding, each rotated 120 degrees from the next copy. Other configurations are contemplated.

The following operation and function of the shield is described in an example environment of the RF transformer located between an amplifier and an antenna to provide isolation and optional step up or step down functions. In operation, an input signal from the amplifier is provided to the input terminals 512A, 512B of the primary winding 508. The input to the primary winding is a differential signal. This establishes an alternating current in the primary winding 508. The current creates a magnetic field which couples into the secondary winding 520. The magnetic field couples into the secondary winding 520 to generate current flow and a voltage in the secondary winding. The output terminal 530 of the secondary winding connects to an antenna to effect transmission of the secondary winding signal from the antenna.

In prior art RF transformer, signals from the secondary winding reflect back into the primary winding, which in turn degrades system performance. In the embodiments shown herein which incorporate shield segments (segment closest to the other winding, such as shield segment 520A) which connect to and are part of, the secondary winding 520. In addition, the shield segments, connect to ground 528 and are adjacent the primary winding. A segment is a shield segment for a fraction of a turn (for a quadrant distance, not a full turn) and then transitions to a position that is not adjacent the primary winding for the remaining distance of the turn. This limits the build-up of charge on the shield segments 520A to ¼ (in the embodiment of FIG. 5A) of the total voltage of the secondary winding 520. The shield segment length is less than one turn, such as generally one quadrant in length.

As shown in FIG. 5A, at node A, which is connected to ground, the voltage is 0 volts. Proceeding along this segment in a clockwise direction to node B, the voltage rises to 2.5 volts. Proceeding to node C, the voltage builds to 5 volts. At node D, the magnetic coupling generates a voltage of 7.5 volts. Finally, at the end of this turn the voltage is at 10 volts at node E, which is the connection point to the antenna. As a result, the primary winding 508 only sees or experiences a maximum reflection of 2.5 volts of electrical coupling, which is a reduction of 75% over prior art designs. If an additional ¼ turn was added to each turn, then the transformer would become a 1:1.25 turn ratio, the output voltage presented to the antenna would be 12.5 volts, yet the reflection from the secondary winding to the primary winding would remain at most 2.5 volts.

In other designs, such as if there are three quadrants, with three waterfall structures, there would be a ⅓ reduction in voltage reflection. The shield segments structure and connection to ground limits the amount of charge build up, and thus reflection, from the secondary winding 520 to the primary winding 508. The secondary conductor segment that is closest to the primary winding is limited in voltage due to the repeated connection to ground, and the limited distance it is directly adjacent to the primary winding, due to the waterfall nature of the design. As shown in FIG. 5A, the secondary winding connects to ground 528 at four locations. This limits the amount of charge build up on the outermost shield segment 520A which in turn limits the amount of charge that can reflect back into the primary winding. The greater the number of quadrants, the lower the amount of charge build up.

Figure 5B:
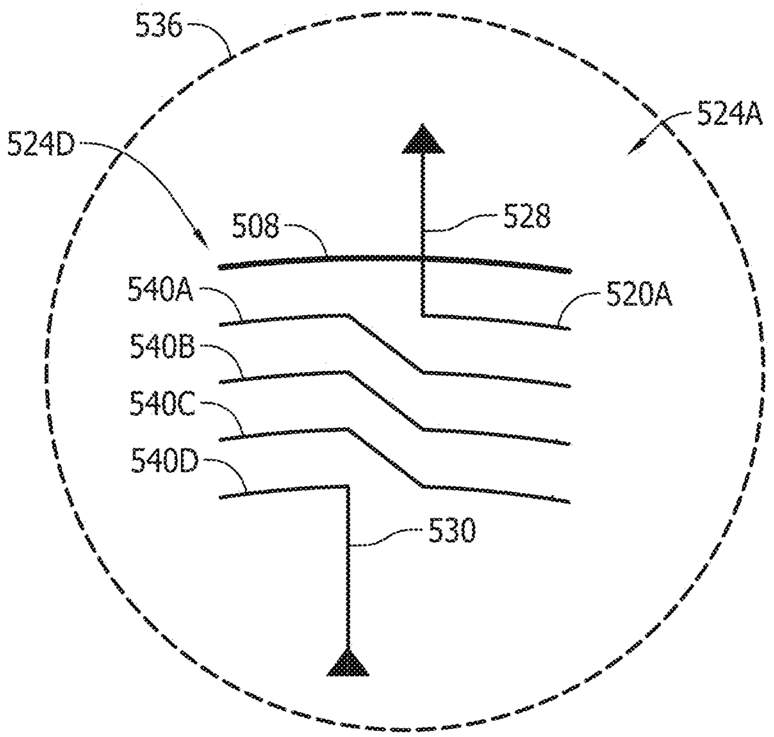
FIG. 5B is an enlarged portion of FIG. 5A.

FIG. 5B illustrates an enlarged portion 536 of one of the transitions (waterfalls) between quadrants. In FIG. 5B, the waterfall transition is between quadrant 524A and 524D. As shown in FIGS. 5A and 5B, the enlarged portion 536 illustrates the primary winding 508 as well as the segments of the secondary winding. In quadrant 524D, shield segment 540A is the outer most segment, but it waterfalls inward to become a waterfall segment in quadrant 524A. Similarly, segment 540B in quadrant 524D waterfalls inward to become a waterfall segment in quadrant 524A. Segment 540C in quadrant 524D waterfalls inward to become a segment in quadrant 524A. The end of segment 520A in quadrant 524A connects to ground 528 while the end of segment 540D in quadrant 524D connects to the output terminal 530, which often connects to an antenna. This configuration shown in the enlarged portion 536, showing the waterfall transition between quadrants, repeats at each of the transitions between quadrants.

In the embodiment of FIGS. 5A and 5B, the outermost segments (such as shield segment 520A), of the secondary winding 520, which is adjacent the primary winding 508, acts as a shield to inhibit and reduce the coupling from the secondary winding 520 to the primary winding 508. The other quadrants also have shield segments which are similar to segments but are not labeled with reference numbers. The shield segments connect to ground 528. Due to the ground connection 528, only a fraction of the total voltage which is established in the secondary winding 520 is adjacent the primary winding. In this example configuration, each outermost segment is only adjacent to the primary winding 508 for ¼ of turn of the winding. Thus, the voltage of the shield segment starts at ground terminal (0 volts) and then proceeds ¼ of a distance of a full turn as the outermost segment. Thus, assuming the secondary winding has a total output of 8 volts, the most charge it can build up is ¼ of 8 volts or 2 volts. This is true for each of the outermost segments. Thus, the total reflection back to the primary winding 508 from the outmost segments of the secondary winding 520 is limited to 2 volts. As mentioned before, reflection from the secondary winding to the primary winding, and thus into the amplifier, negatively impacts amplifier performance, linearity, and may introduce unwanted harmonics.

Stated another way, the RF transformer that has four quadrants (quarterwave design) with four segments (strands) of wire in each quadrant. In each of the quadrants, the outer wires are connected in parallel as a shield to inhibit and reduce coupling to the primary side. The other end of the shield structure is connected in series to one of the freely available three center wires of the other quadrant segments. These connections are repeated in all segments creating wiring diagrams that look like a waterfall such that the wire segment cascades at each transition between quadrants as shown.

Although shown with four quadrants and four segments per quadrant, those values could vary. Contemplated are various designs, such as an octawave design having eight quadrants and eight segments (strands) of wire in each quadrant. For a singled primary winding turn, the eight segments comprise one shield segment adjacent a primary winding and the other seven segments forming the reset of the secondary winding. A greater number of quadrants (divisions) improves performance due to a lower voltage being seen by the primary winding from the secondary winding but increases wiring complexity.

The final end points of the series connected segments are connected together into a single star-point node in the center or in any other arrangement. In this example, this is conveniently located at the center of the transformer, but other locations are contemplated to reduce the length of the output terminal connections. Even though there are four segments of wires in each quadrant, the effective number of turns of each of the series connected wire segment of this example is exactly equal to one. Notably unique to this structure, the ground connection 528 of each of these four outer segments are offset from its neighbor by 90 degrees (¼ turn). It is also observed that only the wires (segments) which are connected to ground are next to the primary winding and therefore any capacitive coupling from the single ended side to the differential side is mostly the ground signal and the scaled down single ended signal.

Another important feature of this structure is the maximum voltage swing that is seen at the outer wires of the waterfall structure is now exactly equal to ¼ of the swing of that of a traditional one turn winding structure. These segments of the secondary winding are also coupled almost evenly to the differential side of the transformer. Specifically, two of the wire segments are coupled to the positive side of the primary winding and the other two are coupled to the negative side of the primary winding.

As a result, the disturbance from the single ended secondary winding to the differential primary windings are significantly lower than that in a traditional prior art transformer. The disturbance is also seen by the electronic circuit, such as an amplifier, that is connected to the primary side but does not appear as common mode noise. Reducing the disturbance seen by the amplifier increases system linearity. This also results in greater power output, such as up to 1 dBm of power. If distortion is considered an important performance parameter, then the increase in output power may be at least 3 dBm. This is a significant improvement because in prior art transformers the disturbance seen by the differential circuit is single ended in nature as well as larger in amplitude than would occur in the newly disclosed structure.

Another beneficial feature of the winding structure disclosed herein is that each of the inner/center strands of wires conducts generally the same amount of current that flows in the outer strands (it has to be because these segments are connected in series). On the other hand, due to magnetic proximity and RF skin effects in a traditional single turn transformer operating at GHz frequency, even with very thick wires, most of the current flows only at the surface of the thick wire that is right next to the opposite winding of the transformer. As a result, the effective series resistance of the waterfall configured (cascading) multi-stranded winding at upper GHz operating frequency is many times smaller than that of the traditional transformer.

While FIG. 5A, 5B only illustrate a transformer with 4 quadrants, any number D of quadrants is possible where D is an integer number that is equal to or larger than 1. For a one turn transformer, the number of segment wires in each quadrant for one turn coil, and for a double-sided shielding structure, is equal to the number of quadrants plus 1 i.e. (D+1). Thus, for D=2 (2 quadrants), the number of segment wires in each quadrant is 3. For N=3, the number of segment wires in each quadrant is 4.

The number of segment wires in each quadrant for a one turn coil and for a single-sided shielding structure is equal to the number of quadrants, i.e., (D). Thus, for D=2 (2 quadrants), the number of segment wires (i.e. segments) in a quadrant is 2. For D=3, the number of segment wires in a segment is 3. For D=4 as shown in FIG. 5A, the number of segment wires in a quadrant is three, plus one for the shield for a total of 4 wire segments in each of the 4 quadrants. For both singled-sided shielding and double-sided shielding, the number of segments (wires) in each quadrant may be increased or decreased to create waterfall fractional turn windings as discussed below.

A higher number of D (quadrants) would result in lower imbalanced of the single ended to differential signal injection. However, a higher D value would also result in higher self-capacitance seen within the multi strand wires because the segment wires are sitting very closely to each other. The improvement in signal injection reduction with a larger D value rapidly diminishes while the inter winding self-capacitance rapidly increases. For maximum balance of single ended to differential injection, it is also suggested to establish N as an even number. Considering the above tradeoffs this means D may be either 2, 4, 8, or more for preferred operation, but other values are contemplated.

Figure 6:
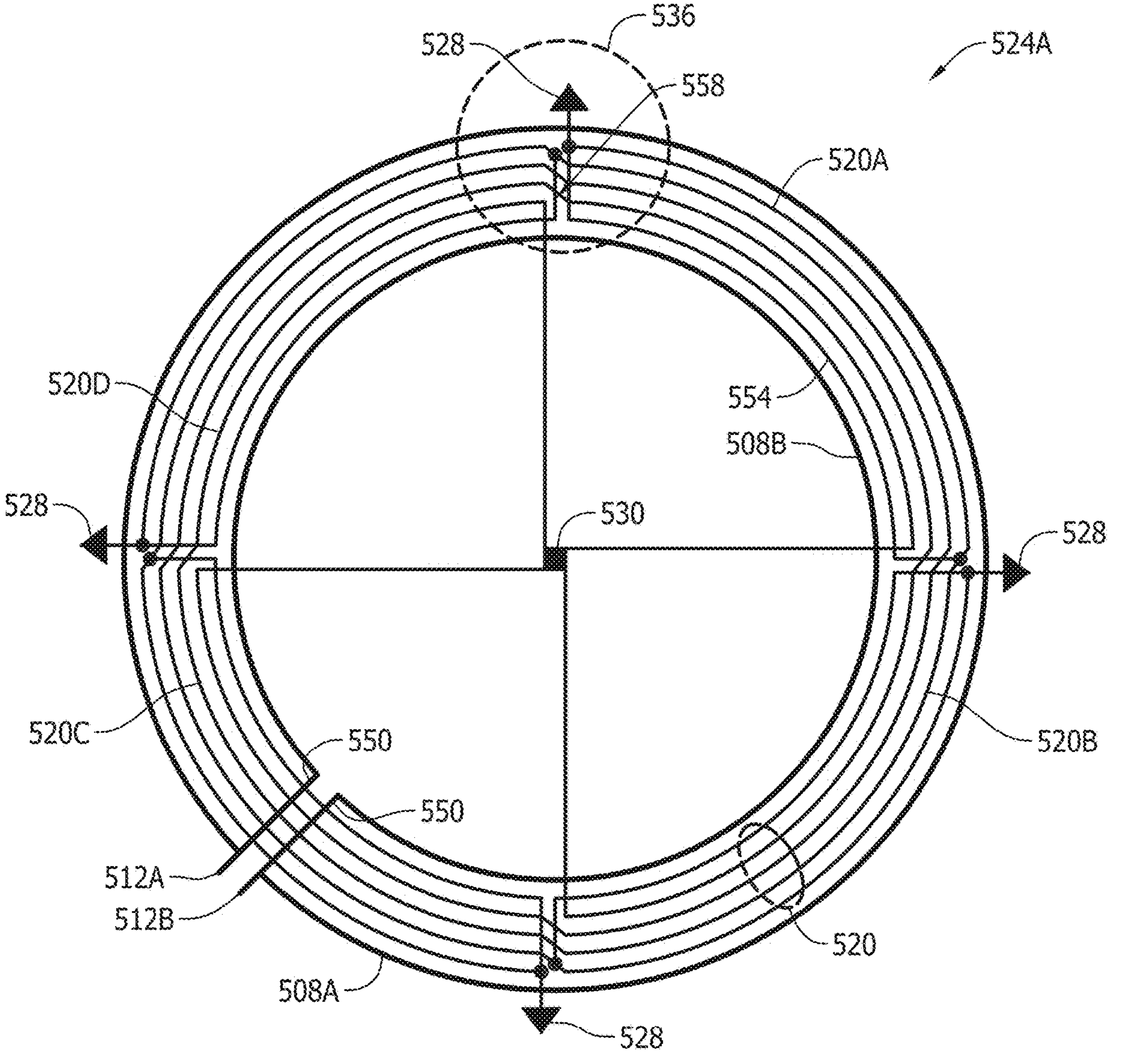
FIG. 6 illustrates an alternative embodiment of the segmented waterfall structure shown in FIG. 5A.

FIG. 6 illustrates an alternative embodiment of the segmented waterfall structure transformer shown in FIG. 5A. This is but one possible configuration and one of ordinary skill in the art may arrive at other configurations or shapes. As compared to FIGS. 5A, 5B, identical elements are labeled with identical reference numbers. In this embodiment, the primary winding 508 includes an outer primary winding 508A and an inner primary winding 508B. The outer primary winding 508A and an inner primary winding 508B are connected by conductors 550, which may be on another layer or level so as to not electrically connect to the secondary windings 520. As in all embodiment, where the primary winding extends over the secondary winding, the two windings do not touch so as to not short out the two windings. The secondary windings 520 include the shield segment 520A, and then three secondary winding waterfall segments 520B, 520C, 520D that complete the turn. This may be referred to as a self-shielding structure. Also shown in this embodiment is an innermost secondary shield segment 554. The innermost secondary shield segments 554 is adjacent the inner primary winding 508B to reduce coupling from the secondary winding to the primary winding 508B as discussed above. The waterfall structure 536, output terminal (antenna connection point) 530, and other aspects are generally similar to FIG. 5A, 5B and are not discussed again. Another important observation is that if a double-sided shielding structure is utilized, theoretically the number of wires per segment is one greater than what is stated for a single sided shielding structure shown in FIG. 5A.

It is also contemplated that a waterfall structure transformer may be configured with only the inner primary winding 508B (FIG. 6) and thus not include the outer primary winding 508A (FIG. 6). In such an embodiment, the outer segment (conductor) in each quadrant can be eliminated as it served as a shield between the secondary winding and the primary winding. Thus, in reference to FIG. 6, in quadrant 524A, the outer secondary segment 520A may be removed.

In one example embodiment, the primary winding may have more than one winding. As such, the outer winding, which is the primary winding of FIG. 5A may make two or more turns to increase the winding count for the primary winding. This may be configured as shown for the primary windings in FIGS. 2D and 2E.

Further, the example embodiments of FIGS. 5A, 5B, and 6, show a 1:1 ratio transformer, however the concept of multi-stranding (segmenting) the transformer winding and waterfalling the segments in a staggered offset manner is also applicable to other transformer ratios, including the previously thought to be impossible non-integer transformer ratio.

Figure 7:
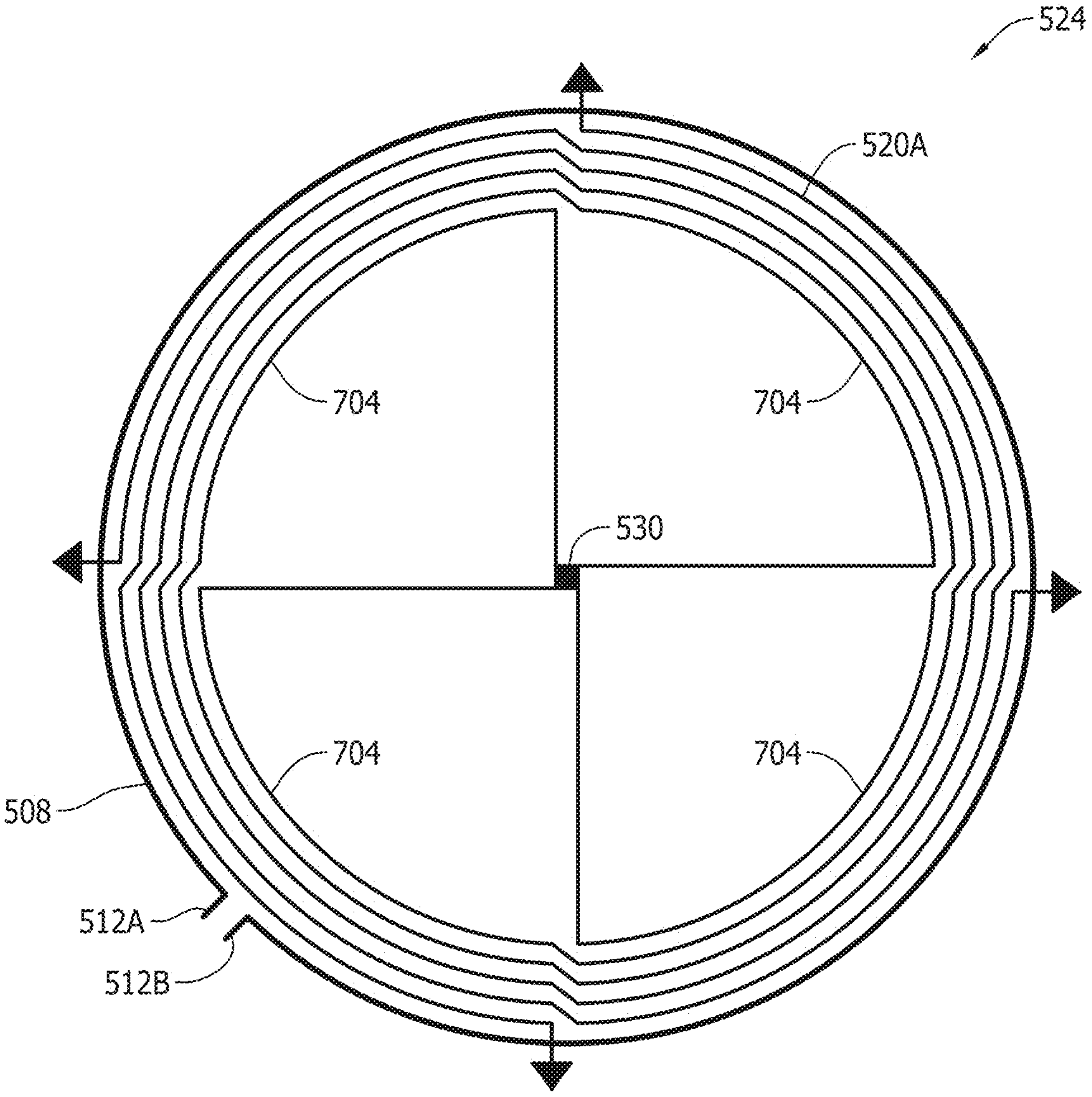
FIG. 7 illustrates one example embodiment of an exemplary non-integer transformer ratios.

For example, if designing a 1:1.25 transformer, another strand of wire (wire segment) in each quadrant of the winding is added in addition to that shown in FIG. 5A. FIG. 7 illustrates one example embodiment of an exemplary non-integer transformer ratio. In reference to FIG. 7, the shield segment (520A of the secondary winding in quadrant 524A) of the multi-stranded (segments) winding is still used for the shield. However, there are now four waterfall segments (wires) in each quadrant while previously for a 1:1 transformer there are only three waterfall segments. The additional wire segment 704 in each quadrant allows each series connected segment of wire to now have a length of 1.25 turns. Once these four 1.25 complete turns are connected in parallel a 1:1.25 ratio transformer is established.

Although shown as a 1:1.25 ratio transformer, it is contemplated that the primary winding could be any value or number of turns either greater than one or less than one (fractional and greater than zero). Likewise, although shown and described as a 1.25 value for the secondary winding, the secondary winding could be made to be any value greater than one including fractional values such as but not limited to 1.1, 1.2, 1.5, 1.75, 2.1, 2.25, 2.5, 2.75, 1⅓, 1⅔, 2⅓, or any other value.

It is also contemplated that a 1:0.75 (or 0.75:1) ratio transformer (ratio of less than 1) could be built by reducing the number of segments (wires) of each quadrant of the secondary winding by one wire. In that case, each of the series connected winding segments has a length of only 0.75 turns. In such an embodiment, the embodiment of FIG. 5A would have one fewer segments in each quadrant. Thus, unlike FIG. 7 where one segment was added in each quadrant, a 0.75 turn ratio would reduce the segment count by one leaving the outer shield segment 520A (FIG. 5A) and then two additional inner waterfall segments for a total of three segments in each quadrant. These values are provided only for purpose of example. When implemented, any value may be used as disclosed herein and as would be understood by one of ordinary skill in the art.

Using this innovative winding technique, it is possible to build certain real number (instead of integer number) ratio, differential to single ended transformers and at the same time have the disclosed shielding structure. In one or more embodiments, the sum of all of the series connected winding pieces are equal to full integer multiples of turns to ensure the coupling coefficient of the resulting transformer is as close to ideal as possible. For example, there are no turns or segments that only extend for a portion of turn (circumference of the winding). Stated another way, the sum of all the turns has to be an integer number. In relation to FIG. 5A, there are four segments per quadrants and there are four quadrants, and each segment extends for ¼ of a turn.

Voltage differential causes the charge loss because current wants to go through the wire, but at high frequencies, the displacement current also happens between wires and this depends on the voltage across the wires. Using the shield segments, each of which are only adjacent the primary winding for a quadrant distance, displacement current is reduced, which increases efficiency.

To calculate the turn number for waterfall segmented winding, take number of segments divided by the number of quadrants. For the embodiment of FIG. 7, there are 5 segments total/4 number of quadrants in a 360° turn which equates to 1.25 turn winding. Note that if there is only one segment, it is similar to a fractional turn embodiment that form a winding as discussed above in FIGS. 2A and 3A. For example, 1 segment total/4 number of quadrants—¼ turn winding. For FIG. 2A, there is one segment and three quadrants, so it is a ⅓ turn winding.

The disclosed designs, for a real number ratio transformer, are extremely useful for many applications because the desired amount of maximum output power may be controlled by the number of turns in the RF transformers. Adjusting output power, by adding or subtracting fractional turns (segments) to create a fractional turn ratio, greatly reduces the complexity required to achieve a desire maximum output power. For example, if slightly more output power is required, but the driving amplifiers are operating at a highly efficient level and a level of great linearity and it is preferred to not change to operating parameters to generate more power, the transformer can be slightly modified, such as by adding a ¼ or ⅓ seconding winding to increase output voltage of the transformer and thus increase the transmit power.

Figure 8A:
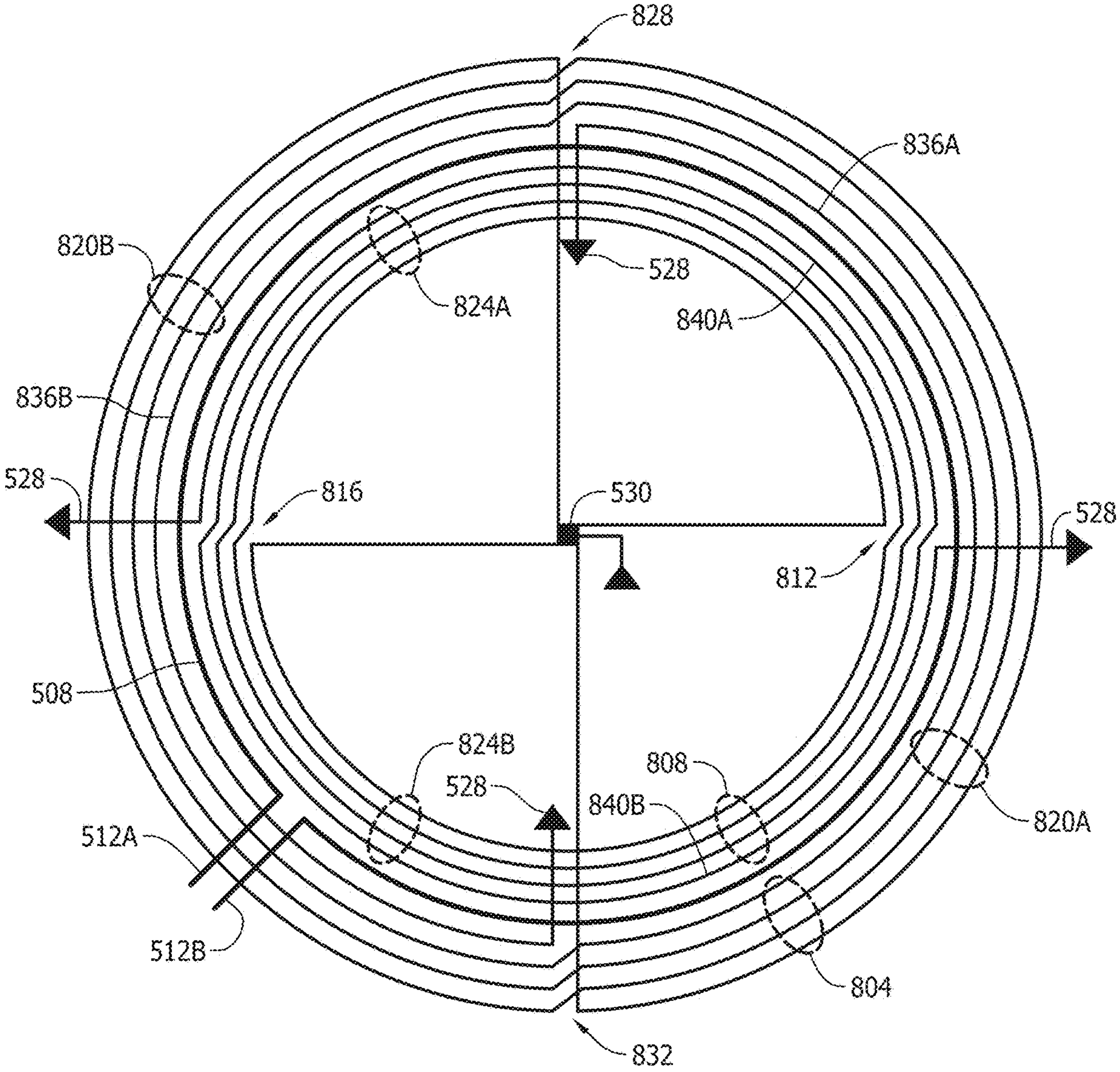
FIG. 8A illustrates an alternative embodiment of a differential to single ended transformer with a 1:2 turn ratio and ½ turn segment lengths.

FIG. 8A illustrates an alternative embodiment of a differential to single ended transformer with a 1:2 turn ratio and ½ turn segment length. As compared to FIG. 5A, identical elements are referenced with identical reference numbers. Further, the secondary winding and shielding structure uses ½ winding quadrants while the earlier example of FIG. 5A uses quarter winding quadrants. This example configuration shows a single turn primary winding and a secondary winding having two shield segments in each quadrant (one on each side of the primary winding).

As discussed above, the primary winding 508 includes input terminals 512A, 512B. In this configuration, the secondary winding is split into an inner secondary winding portion 808 and an outer secondary winding portion 804. In this example embodiment, the 1:2 ratio transformer is shown such that for every turn in the primary winding 508 there will be two turns 804, 808 in the secondary winding. Thus, in this example embodiment, the secondary windings are duplicated but rotated such that there is an outer secondary winding portion 804 located outside of the primary winding 508 and an inner secondary winding portion 808 located on the inside of the primary winding. These two sets of secondary turns 804, 808 are offset from each other by 90 degrees and electrically combined in parallel.

As shown, for the inner secondary winding portion 708, there is a waterfall structure at a first waterfall transition 812 and at a second waterfall transition 816. The waterfall transitions 812, 816 separate the two sections 824A, 824B of the inner secondary winding portion 808. For the outer secondary winding portion 804, there is a waterfall structure at a first waterfall transition 828 an at a second waterfall transition 832. The waterfall transitions 828, 832 separate the two segment groups 820A, 820B (as shown, right quadrant and left quadrant) of the outer secondary winding portion 804.

The inner secondary winding portion 808 has two shield segments 840A, 840B which are adjacent the primary winding 508. The shield segments 840A, 840B function as describe above. The outer secondary winding portion 804 has two shield segments 836A, 836B which are adjacent the primary winding 508. The shield segments 836A, 836B function as described above.

In an equivalent circuit, the secondary winding 804, 808 would comprise four parallel arranged, two turn windings. This is generally equivalent to a two turn winding with four times thicker wire. From the transformer ratio point of view the circuit is indeed a 1:2 transformer. However, in the disclosed embodiment it has a built-in shielding structure 836A, 836B, 840A, 840B to drastically reduce the single ended coupling from the secondary windings 804, 808 to the primary winding 508.

In summary of FIG. 8, the transformer includes 'dual' 2-turn secondary windings made of strands of wires (segments) that are split into ½ turn (circle) segments. Each segment (wire) is connected in such a way that the higher voltage nodes are shielded by the outermost segment that is connected to ground pins 528. Internally some of the higher voltage segments are shielded also to the next lower voltage wires to reduce the effective self-capacitance on the secondary turn. The term 'dual' refers to duplication of the secondary winding 804, 808. One secondary winding turn is located on the inside of the primary winding 508 and the other secondary winding turn is located on the outside of the primary winding. The secondary windings 804, 808 are identical to each other, but one is shifted by 90 degrees to spread the single ended signal coupling more evenly onto the differential primary winding 508.

In this example, single sided shielded structures are shown. The shields are placed next to the primary winding 508. Additional ground shields (in additional to shield segments 836A, 836B, 840A, 840B) could be added if additional primary winding turns are added at the inside and/or outside of the structure of FIG. 8.

All output end terminals are connected to a center point or terminal 530 for balanced connection, such as to an antenna (not shown). All ground terminals 528 are connected together either to the external ground or to another multiple point connection.

The primary winding could have more than one turn and could have center tap or fractional turns and any combinations. In this example only a one turn primary winding is shown.

Figure 8B:
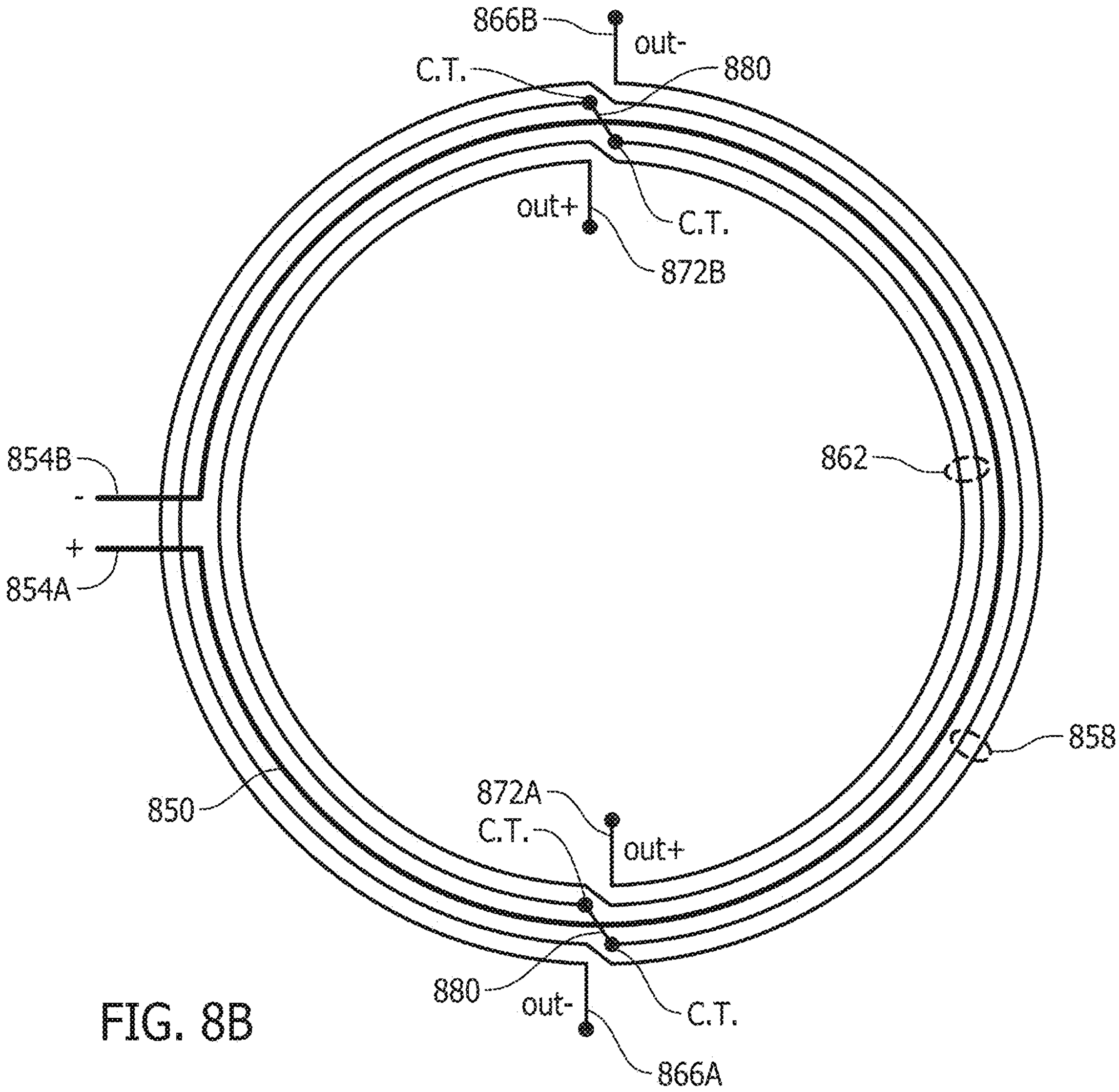
FIG. 8B illustrates a differential input and differential output transformer having waterfall transitions.

FIG. 8B illustrates a differential input and differential output transformer having waterfall transitions. In this example embodiment the number of quadrants, segments, and turns is exemplary only and other embodiments may be created which differ in configuration but do not depart from the inventive concept. Shown is a differential input and differential output transformer with waterfall transitions. When configuring a differential output (as opposed to a single ended output) the coupling to the positive and negative terminals of the secondary winding must be made equal, but opposite in polarity, to match the differential input, which also has two terminals at opposite polarity.

In this embodiment, the primary winding 850 includes a positive polarity input 854A and a negative polarity input 854B. The secondary winding is separated into two quadrants, each separated by a water fall transition. On the outer side of the primary winding 850 are two outer segments 858 of the secondary winding while on the inner side of the primary winding there are two inner segments 862. The secondary winding has two negative polarity output terminals 866A, 866B and two positive polarity output terminals 872A, 872B.

Tracing each conductive path reveals that the primary winding 850 is one turn while the secondary winding is two turns. For example, starting at negative output terminal 866A and proceeding around the winding, two turns are completed before reaching positive output terminal 872A. Likewise, starting at negative output terminal 866B and proceeding around the winding, two turns are completed before reaching positive output terminal 872B. These two paths are connected in series making the ratio of this transformer a 1:2 ratio transformer. Each winding is split into 2 parallel turn to form a ½ wave waterfall structure. A center tap node 880 is provided midway in each turn and it is virtual ground being midway between the positive and negative terminal of each winding. The winding closest to the centertap becomes the shield.

Each output is of opposing polarity and are balanced since each two turn paths (866A to 872A, and 866B to 872B) has equivalent coupling. The outer s 858 and inner segments 862 form the secondary winding and are laid out such that the segments advance, from each positive terminal, 872A, 872B in opposite directions. Thus, if starting at either positive output terminal 872A, 872B the turn advances in a counter clockwise direction. Just the opposite, if starting at negative output terminal 866A, 866B the turn advances in a clockwise direction. This maintains the signal on the positive output terminals 872A, 872B as having opposing polarity to the signals on the negative output terminals 866A, 866B of the secondary winding.

Figure 8C:
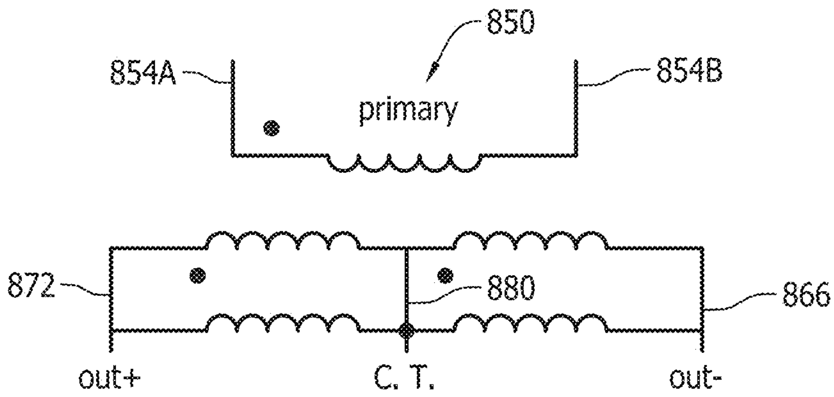
FIG. 8C is a circuit representation of the transformer of FIG. 8B.

FIG. 8C is a circuit representation of the transformer of FIG. 8B. As compared to FIG. 8B, identical reference numbers identify identical element representations. Each winding is two separate winding connected in parallel which has a centertap terminal 880.

The segment closest to the primary winding 850 still functions as a shield as is described above, thereby limiting reflection from the secondary winding to the primary winding. Note that because this embodiment has two quadrants, it reduces the voltage seen, by the primary winding, from the secondary winding, by ½.

Stacked Windings Having Waterfall Transitions and Shield Segments

Figure 9A:
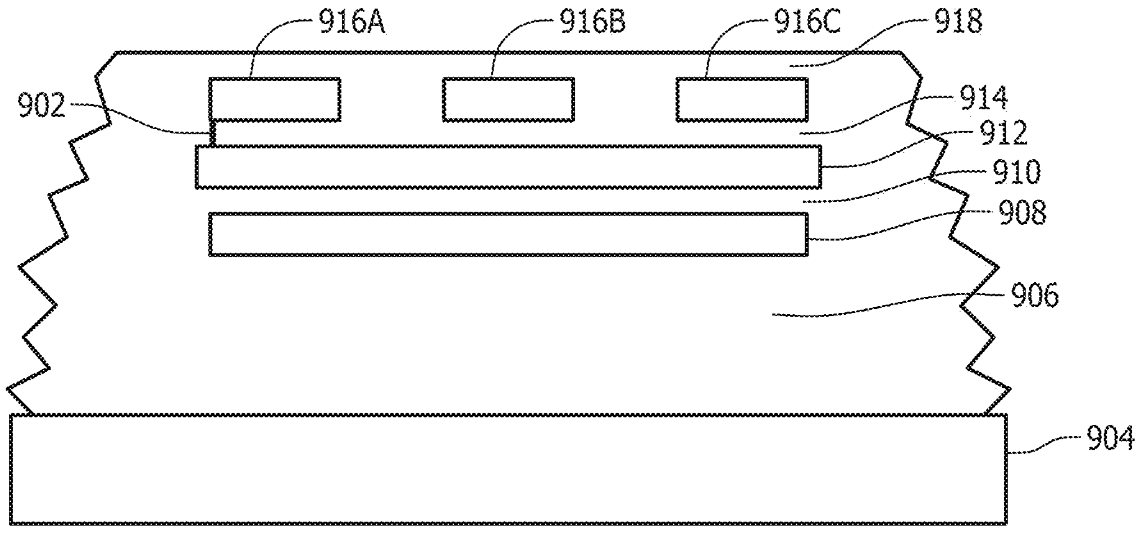
FIG. 9A illustrates a side view of the stacked layers of an exemplary stacked transformer configuration.
Figure 9B:
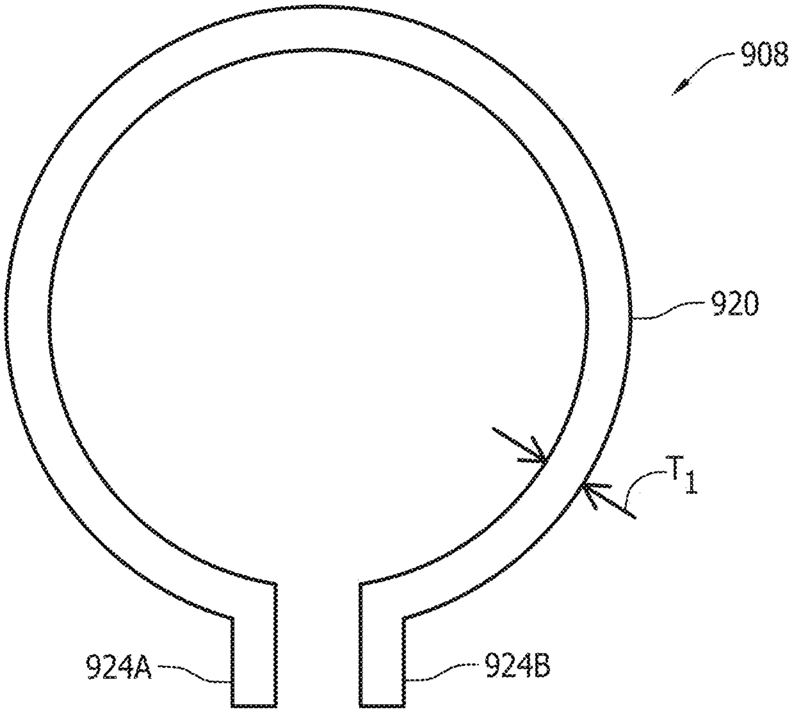
FIGS. 9B, 9C, and 9D illustrates a top view of separated stacked layers of an exemplary stacked transformer embodiment.

It is also disclosed herein that the transformer windings and shield may be in a stacked configuration. In a stacked configuration the various elements of the transformer are layered one on top of another. This is in contrast to the embodiments of FIGS. 5A-8 in which the transformer elements are generally in one plane or layer (except for the interconnects). FIG. 9A illustrates a side perspective view of the stacked layers of an example transformer embodiment. As shown in FIG. 9A, a substrate 904 of a semiconductor device serves as a support layer or base layer. The disclosed transformer may also be placed on above amplifiers or other circuit elements. The substrate may comprise silicon, ceramic, organic material, glass or any other base layer or insulator used in semiconductor devices. The substrate may be part of an integrated circuit die, a printed circuit board, or a semiconductor package. Above the substrate 904 is a thick insulating layer 906. The next layer, above the insulating layer 906, is the primary winding 908 formed of conductive material and configured as shown in FIG. 9B. Covering the primary winding 908 is an insulating layer 910. Adjacent the primary winding 908 moving away from the substrate 904 and on top of the insulating layer 910 are shield sections 912, which is typically a grounded conductive layer. Covering the primary winding 908 is an insulating layer 914 that covers the shield sections 912. Adjacent the shield 912 moving away from the substrate 904 and on top of the insulating layer 914 is the secondary winding 916. The secondary winding segments 916A, 916B, 916C, while stacked on the shield layer, may be arranged all in one plane or layer. Thus, the secondary winding segments 916A, 916B, 916C (FIG. 9D) may be primarily in a single plane and arranged above the shield layer 912, with the exception of the waterfall structure that may use one or more vias or jumpers 902 to extend up (or down) and over a trace of the primary or secondary windings. A jumper 902 connects the shield layer 912 to the segment 916A. Although shown as being stacked upward from the substrate 904, it is contemplated that the stack may be rotated in any direction, such as for example 180 degrees such that the elements stack downward. Of importance is the layered (non-planer) geometry of the windings and shield and the higher voltage winding be located further from the substrate than the lower voltage winding.

It is noted that the primary winding layer 908, which in this embodiment is at a lower voltage than the secondary winding layer 916, is closer to the substrate 904. This reduces interferences and improves performance. If the secondary winding is at a lower voltage than the primary winding, then the secondary winding may be located closer to the substrate than the primary winding.

Figure 9C:
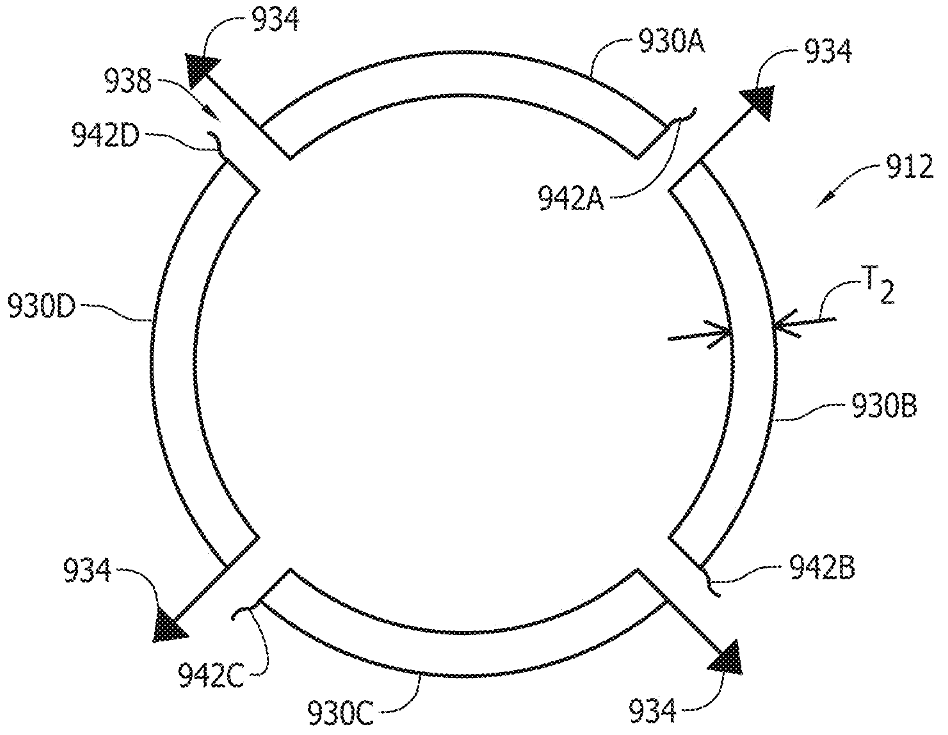
Figure 9D:
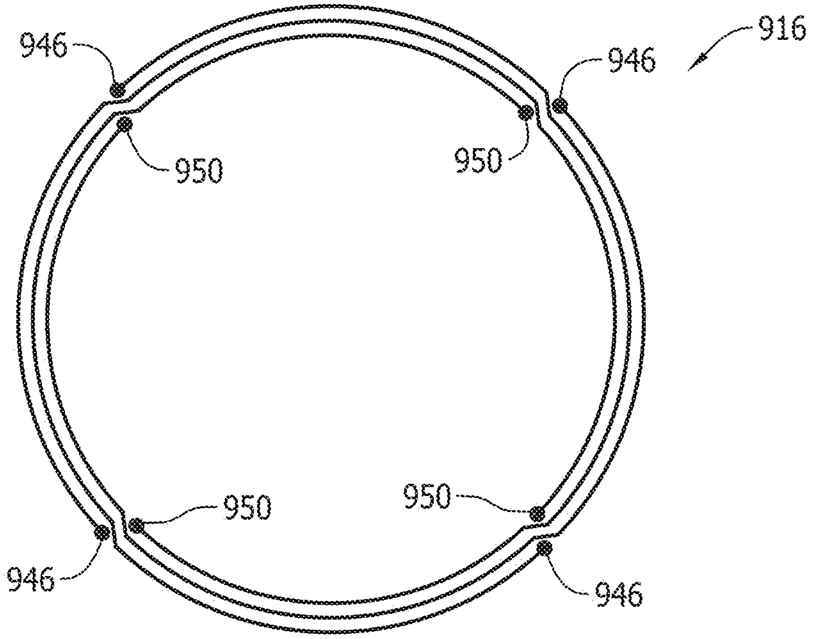

FIGS. 9B, 9C, and 9D illustrate a top separated view of the stacked layers of an exemplary stacked transformer embodiment. This is but one possible configuration and shape, and one of ordinary skill in the art may arrive at any different embodiments without departing from the inventive concept and claims. Each of the layers are stacked one on top of another and are generally aligned along a center axis. As shown in FIG. 9B, the first layer is the primary winding layer 908. In this embodiment, it is a single turn that forms the primary winding conductive layer 920. The width of the conductor is based at least on the number of turns in the secondary winding, the width of the secondary winding, available space, and amount of desired coupling. The conductive layer of the primary winding 920 has two terminals, 924A, 924B.

Covering the primary winding 920 is an insulator layer (now shown). The insulative layer prevents shorting of the primary winding 920 to the shield/secondary winding. Any type non-conductive material may be used for the insulating layer.

Above the primary winding 920 and its associated insulative layer (not shown) is a shield layer 912. This is shown in FIG. 9C. In this embodiment, the shield layer comprises four conductive ground pads 930A, 930B, 930C, 930D which are connected to ground 934. A gap 938 or space exists between each ground pad 930A, 930B, 930C, 930D. The gaps 938 align with the waterfall locations shown in FIG. 9D. The four conductive ground pads 930A, 930B, 930C, 930D also have connection points 942A, 942B, 942C, 942D which connect to the secondary winding shown in FIG. 9D. The shield layer 912 reduces or prevents coupling from the secondary winding into the primary winding.

FIG. 9D illustrates the top layer 916 of the stacked transformer. The top layer 916 comprises the secondary winding. In this embodiment the secondary winding has four quadrants and in each quadrant there are three segments 944A, 944B, 944C connected in parallel. The secondary winding has ground connection points 946 which travel downward toward the shield layer 912 to connect to connection points 942. The opposing terminal 950 of the secondary winding may connect to the antenna or other circuit element. This design shares a waterfall structure similar to that shown in FIG. 5B.

Figure 9E:
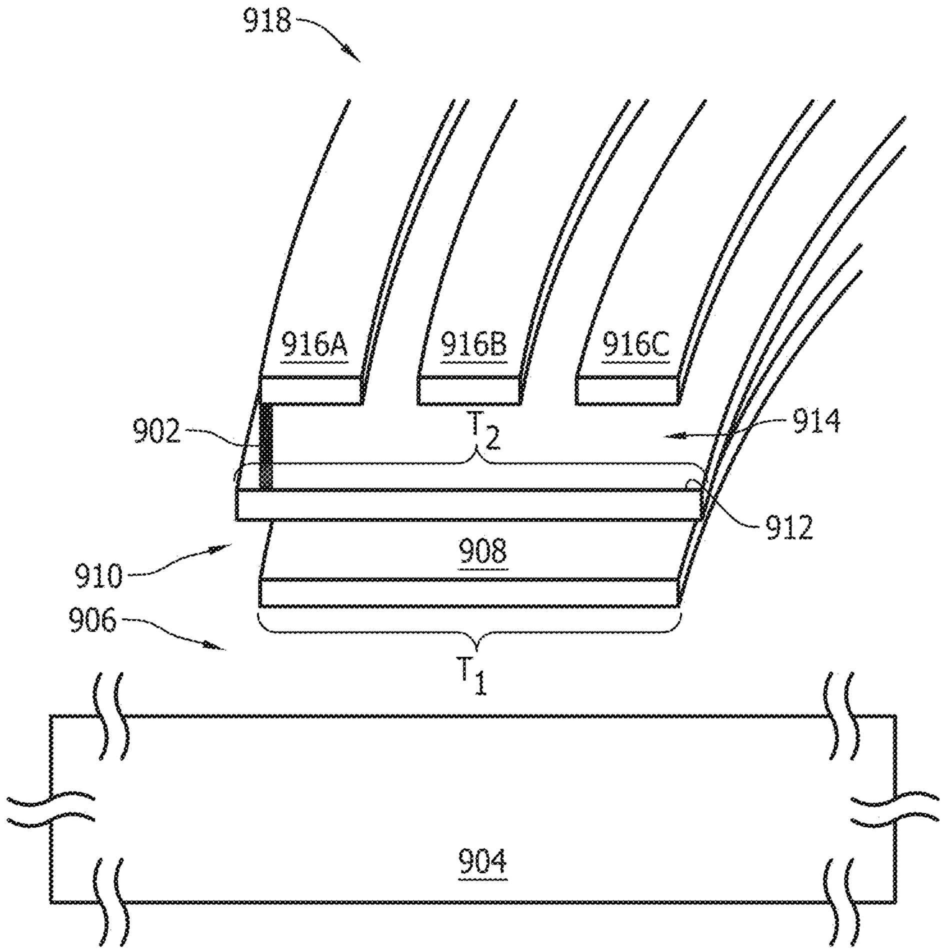
FIG. 9E illustrates a side perspective view of the stacked layers of an exemplary stacked transformer configuration.

FIG. 9E illustrates a side perspective view of the stacked layers of an exemplary stacked transformer configuration. Reference number from FIG. 9A are used in FIG. 9E to aid in understanding. As shown the substrates is on a bottom level. The substrate may extend a distance in all directions. Covering the substrates is an insulating layer 906. This insulating layer may be very thick to avoid coupling or interference between the substrate and the metal layers of the transformer. Above the insulating layer 906 is a section of the primary ending 908, which has a thickness $T_1$. Above the primary winding section 908 is additional insulating material 910, and, on top of the insulating material is the shield section 912, which has a thickness $T_2$.

Above the shield section 912 are the segments 916A, 916B, 916C of the secondary winding. Connecting the outer most segment 916A to the shield segment 912 is a jumper 902, which may also be referred to as a via. Above the secondary windings 916A, 916B, 916C is additional insulating material 918.

One benefit to the stacked transformer configuration is that it places the secondary winding further away from the substrate. This improves performance as compared to designs which place the waterfall structure adjacent the substrates or the same distance from the substrate as the other transformer elements, such as on the same plane. In some embodiments, the secondary winding is at a higher voltage than the primary winding and performance may be improved by locating the secondary winding further from the substrate.

The term quadrant as used herein is defined as sector or a divided section of a winding and is not limited to the term quad meaning four. Thus, the embodiment of FIG. 9 has three quadrants due to the secondary winding being divided into three quadrants, with each quadrant separated by a waterfall structure. Further, although the primary and secondary windings and the shield structure are shown as circular in shape, it is disclosed that these elements, in any embodiment disclosed herein, may be any shapes other than a circular, such as square, triangular, octagon, hexagon, oval, pentagon or any other shape or combination of shapes. As is understood by one of ordinary skill in the art, manufacture of circular shapes in integrated circuit may be more challenging than linear shapes.

Transformers Having Scribe Line Like Structure As Part of Windings

Figure 10A:
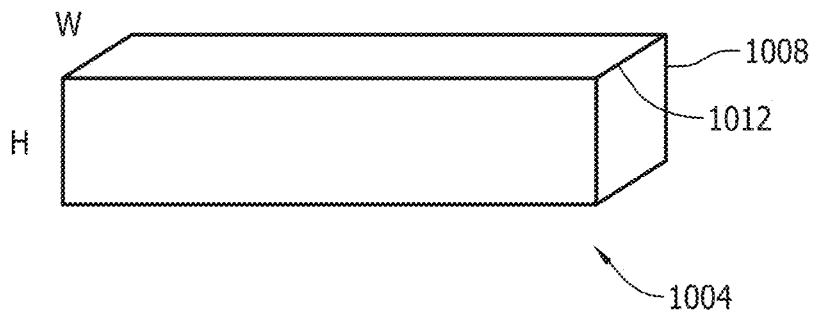
FIG. 10A Prior Art
FIG. 10A illustrates a perspective view of a prior art conductive trace (wire) showing a height to width ratio for an integrated circuit.

FIG. 10A illustrates a perspective view of a prior art conductive trace (wire) having a height to width ratio for an integrated circuit. In this embodiment the conductive trace 1004 is typical of what may be used in winding of either the primary or secondary windings of a transformer as disclosed herein. Due to limitations in semiconductor processing, the conductive trace 1004 has a height H 1008 to width W 1012 ratio of about 1 to 1. Thus, H=W. This is a general ratio and varies with manufacturing process and the process itself. For a given, material and height H 1008 to width W 1012 ratio the conductive trace (wire) 1004 has a set resistance/distance of trace.

Figure 10B:
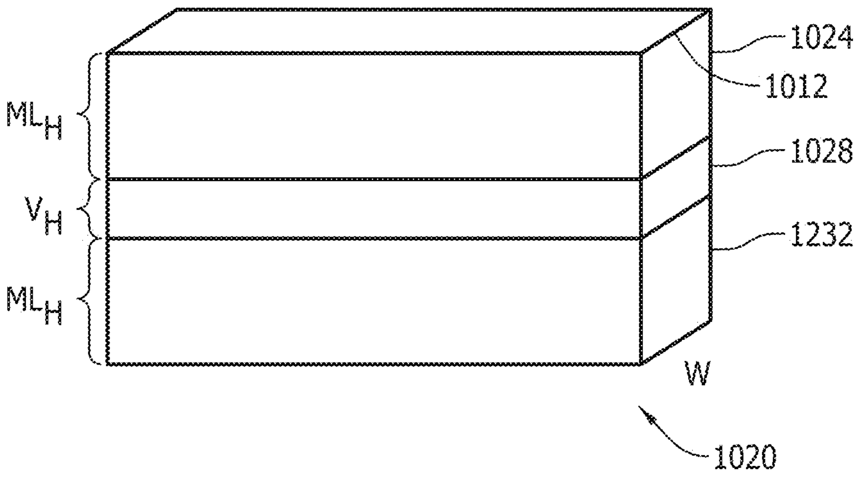
FIG. 10B illustrates a perspective view of a conductive wire showing improved height to width ratio on an integrated circuit.

To reduce resistance, it is proposed to increase the height of the conductive trace while not increasing the width. In many applications it is not possible or desired to increase the width of the conductive trace that forms a winding in a transformer because it affects transformer performance. FIG. 10B illustrates a perspective view of a conductive wire showing improved height to width ratio on an integrated circuit. This configuration may be referred to herein as a via stacked metal layers. As shown the conductive trade 1020 has the same width W 1012 as the configuration of FIG. 10A, but the height is made up of three stacked layers 1024, 1028, 1232. The height H of the layer 1232 is a metal layer height MLH. Conductive layer 1032 is the same general height 1008 as layer 1004 in FIG. 10A. On top of conductive layer 1232 is a scribe line like structure 1028 formed from electrically conductive material, formed from a row of electrically connected vias. The height H of the layer 1028 is a via height VH. Layer 1028 may be any height manufacturable but is typically about ½ H in height. Scribe lines are described in U.S. Publication Number US2014/0077320 published Mar. 20, 2014 and titled Scribe Lines in Wafers, which is incorporated by reference in its entirety herein. Placing one or more electrically connected rows of vias on top of the metal layer 1232 allows for the build-up of two or more metal layers 1024, 1232. Placing a metal layer 1024 directly on a metal layer 1232 may not be allowed in semiconductor manufacturing processes or may add to the cost of the manufactured semiconductor device, but use of scribe line like structures between metal layers allows an increase in the height of a transformer winding.

On top of the via layer 1028 is another metal layer 1024. The height H of the layer 1232 is a metal layer height MLH. Layer 1232 is the same general height 1008 as layer 1004 in FIG. 10A. As a result, while the width W 1012 of the conductive trace 1020 is the same as the width 1012 shown the prior art (FIG. 10A), the height is much greater, in this embodiment MLH+VH+MLH, which is about 2.5 times the height of the prior art embodiment.

The additional height of the conductive trace which forms the winding of a transformer causes the trace to have lower resistance/impedance for a given length as compared to a prior art winding. This provides additional benefits related lower resistance/impedance as is discussed above.

Figure 11A:
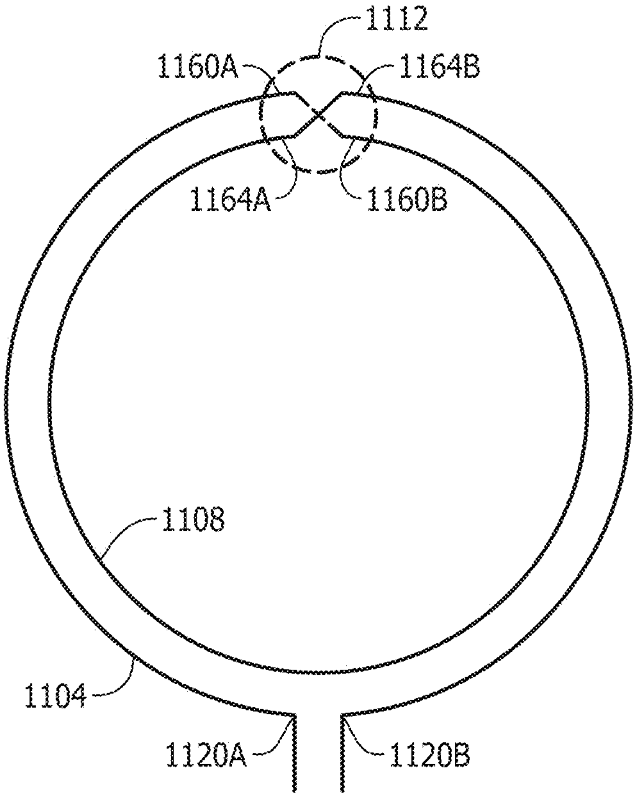
FIG. 11A illustrates a top view of an exemplary transformer winding with a crossover feature.
Figure 11B:
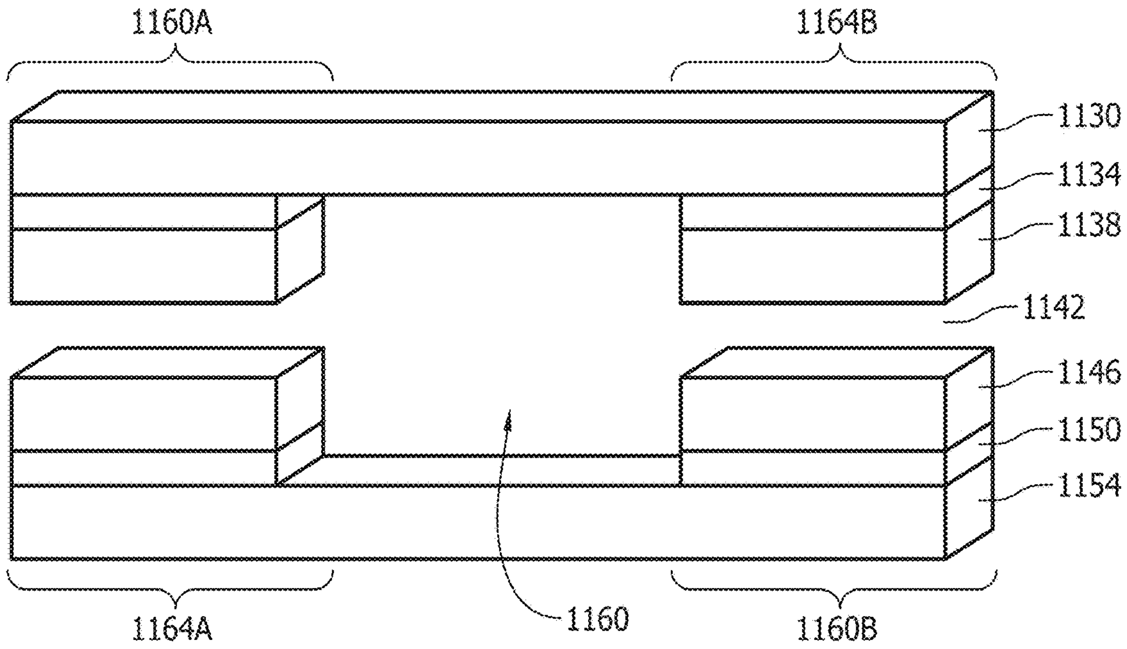
FIG. 11B illustrates a side view of a portion of the exemplary transformer winding shown in FIG. 11A.

FIG. 11A illustrates a top view of an exemplary transformer winding with a crossover feature. This configuration is shown for purposes of discussion. Via stacked metal layers may be used to form any winding or conductive path shown or described herein. In FIG. 11A, the winding is a two-turn winding having a first turn 1104 and a second turn 1108. The turns 1104, 1108 perform a crossover at area 1112. The turns have terminals 1120A, 1120B. As shown, winding section 1160A crosses over to become winding section 1160B. Winding section 1164A crosses over to become winding section 1164B. The area FIG. 11B illustrates a side view of a portion of the exemplary transformer winding shown in FIG. 11A. The portion shown in FIG. 11B is reflected in call out 1112 in FIG. 11A. As shown, winding section 1160A crosses over to become winding section 1160B. Winding section 1164A crosses over to become winding section 1164B. These reference numbers and elements may be cross-referenced in FIG. 11A to aid in understanding. Layers 1130 and 1138 are metal (conductive) layers while layer 1134 is a scribe line like structure of electrically connected and conductive vias which electrically connect the metal layers 1130, 1138. Between the layers is a gap or space 1142, typically an insulating material. Also shown is metal layer 1146, via scribe line layer 1150 and metal layer 1154. The via layer 1150 is between and electrically connects the metal layers 1146, 1154. Power and ground lines may also be configured with stacked metal and scribe line like structures.

At the crossover 1160, certain layers are omitted to allow for the crossover and overlap of the winding without shorting the stacked conductive layers. The crossover area may be filled with oxide, which is one exemplary insulator. As such, the via layer 1134 and metal layer 1138 are eliminated and the via layer 1150 and metal layer 1154 are eliminated. In this open area 1160 the outer winding becomes the inner winding and the inner winding becomes the outer winding at the crossover.

Figure 12:
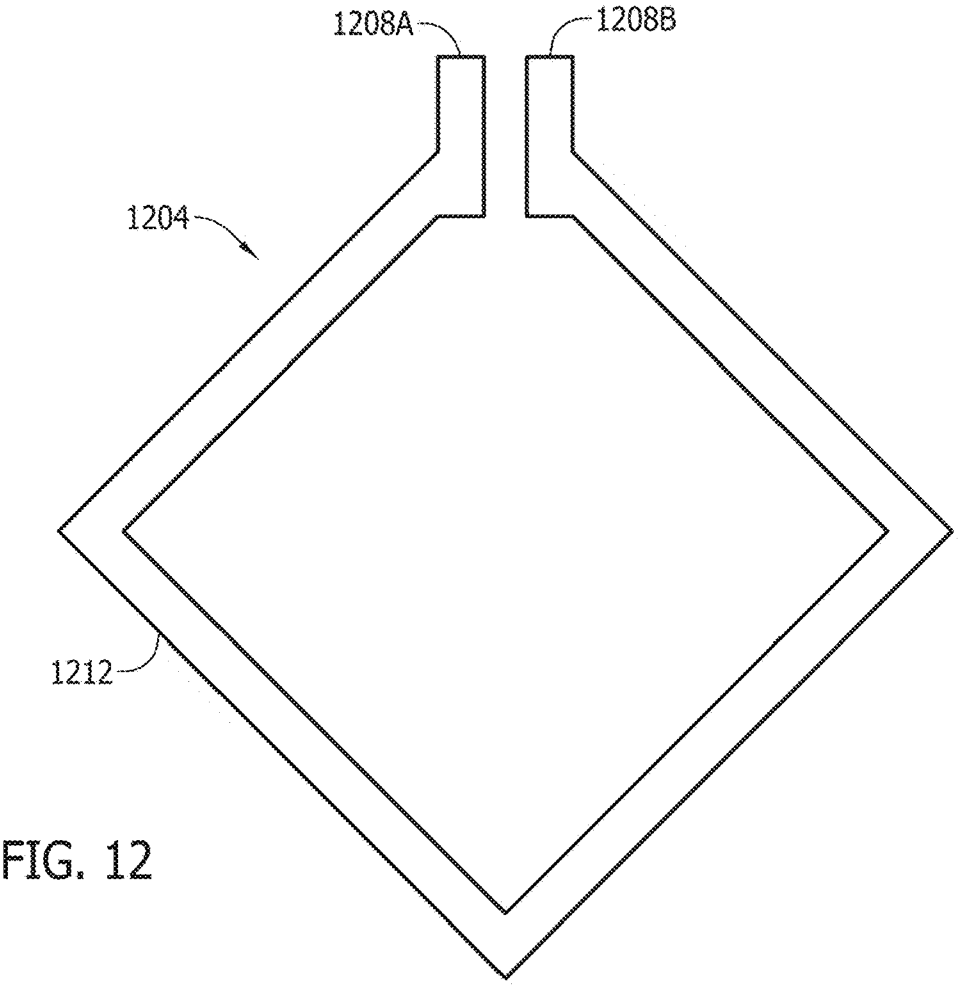
FIG. 12 illustrates an alternative embodiment of the structure for a primary winding and secondary winding.

FIG. 12 illustrates an alternative configuration for the structure of a primary winding and secondary winding. As discussed herein the physical shape of the various transformer primary windings, shield structure, and secondary winding may assume various shapes and configuration. The diamond shape of FIG. 12 is one such configuration which includes a primary winding 1212 and two terminals 1208A, 1208B. When laying out circuit masks and depositing integrated circuits, squares, diamonds or other more linear shapes may be preferred. This shape and configuration may be used with any embodiment disclosed herein and additional embodiments derived from this disclosure. Although the primary winding is shown, based on the teaching from the other embodiments, the shield structure and secondary winding may have a generally similar shape to allow the primary winding to be in close proximity to the secondary winding, which in turn maximizes the coupling coefficient.

Figure 13:
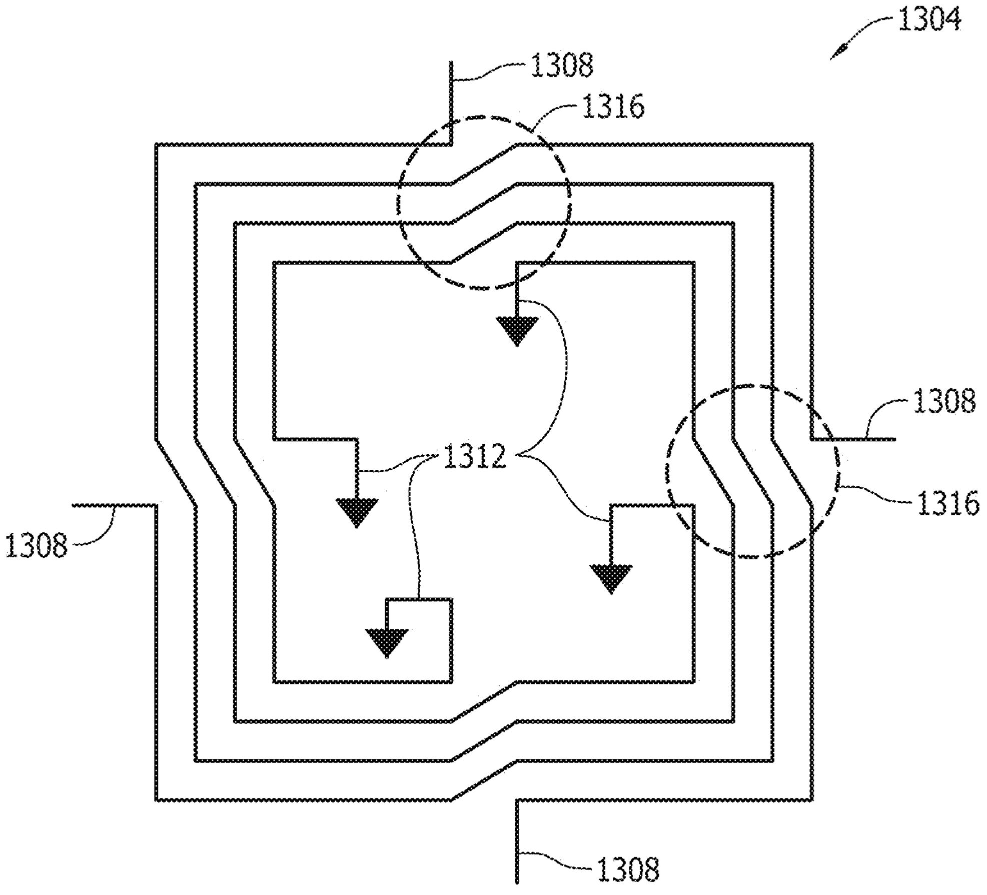
FIG. 13 illustrates a waterfall winding structure in a square or diamond configuration.

FIG. 13 illustrates a waterfall winding structure in a square or diamond configuration. As mentioned above on numerous occasions, the shapes of the transformer is not limited to a particular geometric shape or configuration. FIG. 13 illustrates an example configuration for a waterfall winding structuring 1304 in a square or diamond configuration. This is a four-quadrant configuration having output terminals 1308 and ground terminals 1312. Each quadrant is separated by a waterfall transition 1316. In this embodiment, the ground terminals 1312 are on the inner area of the winding, and as a result other winding (primary or secondary) would be in the inner area adjacent the shield segments connected to ground 1312

Figure 14:
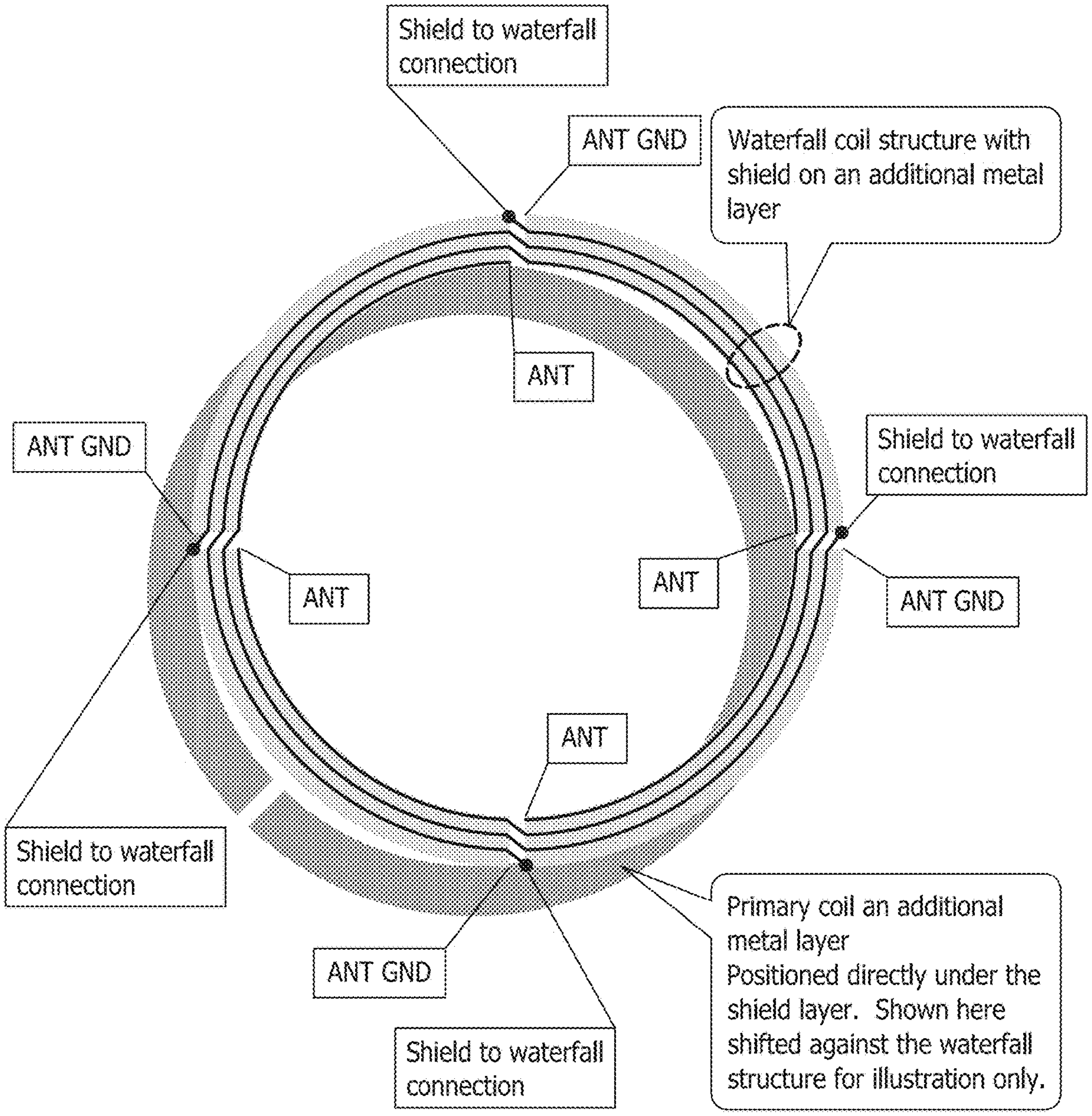
FIG. 14 illustrates a top view of the elements of a stacked transformer with waterfall transitions.

FIG. 14 illustrates a top view of the elements of a stacked transformer with waterfall transitions. In this embodiment, text call-outs are provided to aid in understanding and provide additional disclosure. The primary winding (coil) is offset to provide a better visual representation given limitations of patent drawings. When configured for operation, the primary winding (coil) would be aligned with the shield segment and the segments of the secondary winding.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A transformer comprising:

a primary winding comprising one or more conductors and having two or more terminals; and a secondary winding adjacent the primary winding, the secondary winding comprising a turn divided into two or more segments, the two or more segments including:

a first segment comprising a first shield segment and a first waterfall segment, and a second segment comprising a second shield segment and a second waterfall segment, wherein first ends of the first and second shield segments are each connected to ground, wherein second ends of the first and second shield segments are respectively connected to first ends of the first and second waterfall segments, wherein second ends of the first and second waterfall segments are each conductively coupled to an output node for the secondary winding, wherein the first and second waterfall segments are further from the primary winding than the first and second shield segment, respectively, and wherein the first shield segment is configured to shield the primary winding from reflection of voltage on the second waterfall segment.

2. The transformer of claim 1 wherein the transformer is part of a printed circuit board, ceramic substrate, a semiconductor package, or a semiconductor die that also contains integrated circuits.

3. The transformer of claim 1 wherein either the primary winding, the secondary winding, or both are formed from first and second metal layers separated by a via layer and shorted together by one or more rows of vias disposed in the via layer.

4. The transformer of claim 1, wherein the secondary winding comprises a plurality of turns and wherein there is one shield segment in each turn.

5. The transformer of claim 1 wherein the turn is divided into a number of quadrants and for a 1:1 turn ratio a number of segments in each quadrant is equal to the number of quadrants.

6. The transformer of claim 1 wherein the turn is divided into a number of quadrants and for a turn ratio of 1:>1, a number of segments in each quadrant is greater than the number of quadrants.

7. The transformer of claim 1 wherein the turn is divided into a number of quadrants and for a turn ratio of 1:<1, a number of segments in each quadrant is less than the number of quadrants.

8. The transformer of claim 1, wherein the first segment comprises a third waterfall segment, wherein the second segment comprises a fourth waterfall segment, wherein the second ends of the first and second waterfall segments are respectively connected to first ends of the third and fourth waterfall segments, and wherein second ends of the third and fourth waterfall segments are each conductively coupled to the output node for the secondary winding.

9. A transformer comprising:

a first winding; and a second winding including a plurality of waterfall structures electrically coupled together, each waterfall structure comprising a waterfall transition and a shield segment.

10. The transformer of claim 9 wherein the first winding has a fractional winding structure.

11. The transformer of claim 9, wherein the first winding may be singled ended input/output or differential input/output and the shield segments included in the second winding are connected to a ground.

12. A transformer comprising:

a substrate;

a primary winding located over the substrate, the primary winding formed from an electrically conductive material and having a first terminal and a second terminal;

a first insulating material layer covering the primary winding;

a plurality of shield sections located over the first insulating material layer and aligned with the primary winding, each the plurality of shield sections having a first end connected to ground and a second end;

a second insulating material layer covering the plurality of shield sections; and a secondary winding located over the second insulating material layer and aligned with the primary winding and the plurality of shield sections, the secondary winding comprising:

a first electrically conductive waterfall segment formed over a first shield segment of the plurality of shield segments, the first waterfall segment having a first end connected to a second end of a second shield segment of the plurality of shield segments and a second end conductive coupled to an output terminal, and a second electrically conductive waterfall segment formed over the second shield segment, the second waterfall segment having a first end connected to a second end of a shield segment of the plurality of shield segments other than the second shield segment and a second end conductive coupled to the output terminal.

13. The transformer of claim 12 wherein the primary winding, the secondary winding, or both are formed first and second stacked metal layers separated by a via layer and shorted together by one or more rows of vias disposed in the via layer.

14. The transformer of claim 12 wherein the plurality of shield sections include spacers between each shield section and the spacers align with the waterfall structure.

15. The transformer of claim 12 wherein the transformer is configured as one of the following: discrete element, part of a printed circuit board, part of a semiconductor package, part a semiconductor die containing integrated circuits.

16. The transformer of claim 12 wherein the insulating material covering the two or more shield sections is two or more layers in thickness.

17. An integrated transformer comprising:

a first winding formed from an electrically conductive material having a first terminal and a second terminal;

a first insulating material layer covering the first winding;

a plurality of shield sections located above and aligned over the first winding, each of the plurality of shield sections having a first end connected to ground and a second end;

a second insulating material layer covering the plurality of shield sections; and a second winding located above and aligned over the first winding and the plurality of shield sections, the second winding comprising:

a first electrically conductive waterfall segment formed over a first shield segment of the plurality of shield segments, the first waterfall segment having a first end connected to a second end of a second shield segment of the plurality of shield segments and a second end conductive coupled to an output terminal, and a second electrically conductive waterfall segment formed over the second shield segment, the second waterfall segment having a first end connected to a second end of a shield segment of the plurality of shield segments other than the second shield segment and a second end conductive coupled to the output terminal.

18. The transformer of claim 17 wherein the first winding, the second winding, or both are formed first and second stacked metal layers separated by a via layer and shorted together by one or more rows of vias disposed in the via layer.

* * * * *